United States Patent
Ryu

(10) Patent No.: US 12,080,093 B2
(45) Date of Patent: Sep. 3, 2024

(54) ULTRASONIC SENSOR AND DISPLAY APPARATUS INCLUDING THE SAME

(71) Applicant: LG Display Co., Ltd., Seoul (KR)

(72) Inventor: Kyungyeol Ryu, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/507,536

(22) Filed: Oct. 21, 2021

(65) Prior Publication Data
US 2022/0129658 A1    Apr. 28, 2022

(30) Foreign Application Priority Data
Oct. 26, 2020 (KR) ................ 10-2020-0139650

(51) Int. Cl.
*G06V 40/13* (2022.01)
*H10N 30/857* (2023.01)
*H10N 30/87* (2023.01)

(52) U.S. Cl.
CPC ....... *G06V 40/1306* (2022.01); *H10N 30/857* (2023.02); *H10N 30/877* (2023.02)

(58) Field of Classification Search
CPC .............. G06K 9/0002; H01L 41/0477; H01L 41/193; G06F 21/32; G06F 2203/0338; G06V 40/1306
See application file for complete search history.

(56) References Cited

U.S. PATENT DOCUMENTS

| | | | |
|---|---|---|---|
| 2008/0149371 A1* | 6/2008 | Schrooten | H05K 3/202 |
| | | | 174/254 |
| 2014/0050054 A1 | 2/2014 | Toda et al. | |
| 2014/0083971 A1* | 3/2014 | Fujii | H01L 41/332 |
| | | | 252/79.3 |
| 2017/0003823 A1* | 1/2017 | Sakuda | G06F 3/0418 |
| 2018/0179409 A1* | 6/2018 | Teragawa | H01B 1/22 |
| 2019/0189904 A1* | 6/2019 | Benedict | H01L 41/0477 |
| 2020/0125815 A1* | 4/2020 | Lu | G06V 10/17 |
| 2020/0212266 A1* | 7/2020 | Shimizu | C09K 11/02 |
| 2020/0241670 A1* | 7/2020 | Abu Saude | G06F 3/045 |
| 2021/0209325 A1* | 7/2021 | Liu | H05K 3/323 |

FOREIGN PATENT DOCUMENTS

KR    10-2018-0090136 A    8/2018

* cited by examiner

*Primary Examiner* — Hang Lin
(74) *Attorney, Agent, or Firm* — Birch, Stewart, Kolasch & Birch, LLP

(57) ABSTRACT

An ultrasonic sensor comprises a substrate, a piezoelectric member disposed at the substrate and an upper electrode disposed on the piezoelectric member. The upper electrode includes a silver paste.

30 Claims, 20 Drawing Sheets

ULTRASONIC SENSOR AND DISPLAY APPARATUS INCLUDING THE SAME

CROSS-REFERENCE TO RELATED APPLICATIONS

This application claims the priority benefit of the Korean Patent Application No. 10-2020-0139650 filed on Oct. 26, 2020 in the Republic of Korea, the entire contents of which are hereby expressly incorporated by reference as if fully set forth herein into the present application.

BACKGROUND

Technical Field

The present disclosure relates to an ultrasonic sensor and a display apparatus including the same, and more particularly, to an ultrasonic sensor capable of recognizing a user's biometric information and a display apparatus including the same.

Discussion of the Related Art

In our information society, a demand for a display apparatus for displaying an image has increased in various forms. As a display apparatus, various display apparatuses such as a liquid crystal display (LCD), an organic light emitting display (OLED), and a quantum dot light emitting display (QLED) are used.

The display apparatus can be applied to various electronic apparatuses such as a smartphone, a tablet, a notebook computer, a monitor, and a TV. In particular, in recent years, portable electronic apparatuses such as smartphones, tablets, and notebook computers have been increasingly used due to the development of mobile communication technologies.

In addition to a communication function, portable electronic apparatuses store personal information such as contact information, call history, messages, photos, memos, user's web surfing information, location information, and financial information. Therefore, in order to prevent personal information from being leaked from the portable electronic apparatuses, various security methods for protecting the personal information have been applied to the portable electronic apparatuses. Among the security methods, fingerprint authentication permits the use of an electronic device based on a user's fingerprint, which is biometric information, and thus has higher security than other security methods such as password authentication or pattern authentication.

Generally, fingerprint sensors for fingerprint authentication can be classified into an optical fingerprint sensor, an ultrasonic fingerprint sensor, an infrared fingerprint sensor, and a capacitive fingerprint sensor according to an operating principle. The ultrasonic fingerprint sensor can recognize a fingerprint by receiving, through an ultrasonic receiver, an ultrasonic wave generated by an ultrasonic generator and reflected from the user's fingerprint pattern including valleys and ridges of the user's fingerprint.

However, in an ultrasonic sensor including a polyvinylidene fluoride (PVDF) film as a piezoelectric member and a display apparatus including the same ultrasonic sensor, configuration defects can occur in an upper electrode or a piezoelectric member caused by a manufacturing process or a configuration defect, which can degrade reliability when applied to a display apparatus or a portable electronic apparatus.

SUMMARY

An ultrasonic sensor and a display apparatus including the same can have limitations in that configuration defects can occur in an upper electrode or a piezoelectric member caused by a manufacturing process or a configuration defect.

Thus, the inventor of the present disclosure invented an ultrasonic sensor including an upper electrode and a piezoelectric member which are stable in structure and processes, and a display apparatus including the same.

Accordingly, the present disclosure is directed to providing an ultrasonic sensor and a display apparatus including the same that substantially obviate one or more problems due to limitations and disadvantages of the related art.

An aspect of the present disclosure is directed to providing an ultrasonic sensor including an upper electrode and a piezoelectric member which are stable in structure and process, and a display apparatus including the same.

Another aspect of the present disclosure is directed to providing an ultrasonic sensor having excellent ultrasonic reception and transmission performance, and a display apparatus including the same.

Additional features and aspects will be set forth in part in the description that follows, and in part will become apparent from the description, or may be learned by practice of the inventive concepts provided herein. Other features and aspects of the inventive concepts may be realized and attained by the structure particularly pointed out in the written description, or derivable therefrom, and claims hereof as well as the appended drawings.

To achieve these and other aspects of the inventive concepts, as embodied and broadly described herein, an ultrasonic sensor comprises a substrate, a piezoelectric member disposed at the substrate, and an upper electrode disposed on the piezoelectric member, the upper electrode includes a silver paste.

In another aspect of the present disclosure, an ultrasonic sensor comprises a piezoelectric member disposed on a substrate, a lower electrode disposed under the piezoelectric member; an upper electrode disposed to face the lower electrode and disposed on the piezoelectric member, and a supporting member disposed between the substrate and the lower electrode, the upper electrode and the lower electrode include a silver paste.

In another aspect of the present disclosure, a display apparatus comprises a cover member including a display area and an ultrasonic sensor area, a display device disposed at a rear surface of the cover member and overlapping with the display area, and an ultrasonic sensor disposed at the rear surface of the cover member and overlapping with the ultrasonic sensor area.

According to an embodiment of the present disclosure, un ultrasonic sensor and a display apparatus including the same, in which a piezoelectric member and an upper electrode are stable in structure and process, may be provided.

Also, according to an embodiment of the present disclosure, an ultrasonic sensor and a display apparatus including the same, in which transmission and reception sensitivity of ultrasonic waves are improved may be provided.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure.

It is to be understood that both the foregoing general description and the following detailed description of the present disclosure are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with description serve to explain the principle of the disclosure.

FIG. 31 shows results of measuring a phase and an impedance according to a frequency of an ultrasonic sensor of the experimental example of FIG. 26; and.

Figure 1:
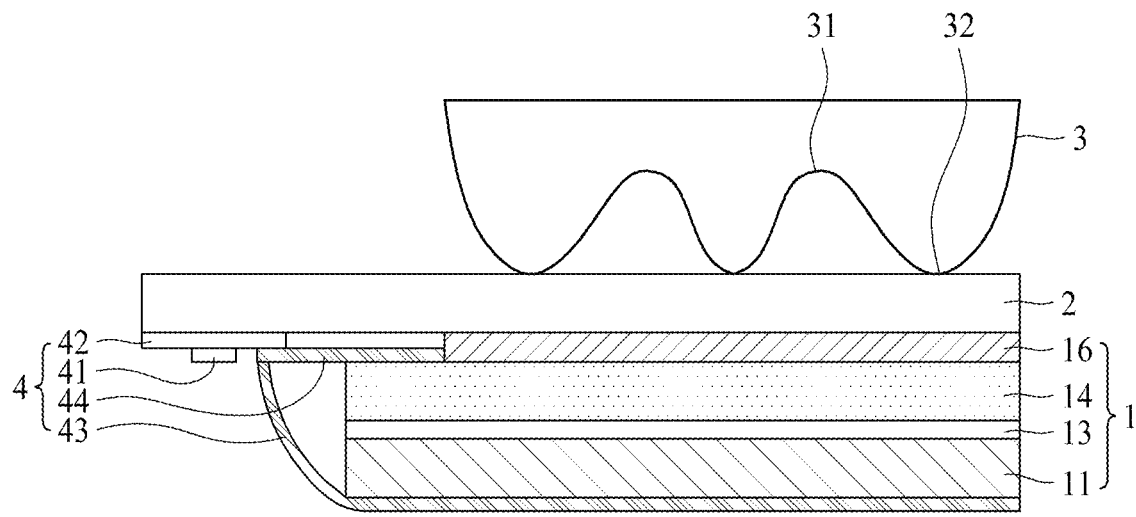
FIG. 1 is a cross-sectional view of an ultrasonic sensor according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION OF THE EMBODIMENTS

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. When "comprise," "have," and "include" described in the present disclosure are used, another part may be added unless "only" is used. The terms of a singular form may include plural forms unless referred to the contrary.

In construing an element, the element is construed as including an error range or tolerance range although there is no explicit description of such an error or tolerance range.

In describing a position relationship, for example, when a position relation between two parts is described as, for example, "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case which is not continuous may be included unless a more limiting term, such as "just," "immediate(ly)," or "direct(ly)" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as "first," "second," "A," "B," "(a)," "(b)," etc., may be used. These terms are intended to identify the corresponding elements from other elements, and basis, order, or number of the corresponding elements should not be limited by these terms. The expression that an element is "connected," "coupled," or "adhered" to another element or layer, the element or layer can not only be directly connected or adhered to another element or layer, but also be indirectly connected or adhered to another element or layer with one or more intervening elements or layers "disposed," or "interposed" between the elements or layers, unless otherwise specified.

The term "at least one" should be understood as including any and all combinations of one or more of the associated listed elements. For example, the meaning of "at least one of a first element, a second element, and a third element" denotes the combination of all elements proposed from two or more of the first item, the second item, and the third item as well as the first item, the second item, or the third item.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship.

Hereinafter, embodiments of the present disclosure will be described in detail with reference to the accompanying drawings. Further, all the components of each ultrasonic sensor and each display apparatus having the ultrasonic sensor according to all embodiments of the present disclosure are operatively coupled and configured. For convenience of description, a scale of each of elements illustrated in the accompanying drawings differs from a real scale, and thus, is not limited to a scale illustrated in the drawings.

FIG. 1 illustrates an ultrasonic sensor according to an embodiment of the present disclosure.

With reference to FIG. 1, an ultrasonic sensor 1 according to an embodiment of the present disclosure includes a substrate 11, a piezoelectric member 14 disposed on the substrate 11, an upper electrode 16 disposed on an upper surface of the piezoelectric member 14, and a conductive adhesive member 13 disposed between the substrate 11 and the piezoelectric member 14.

The substrate 11 can be at least one of a metal substrate, a plastic substrate, and a glass substrate.

When a metal substrate is used as the substrate 11, it can include at least one of a brass substrate and an aluminum substrate, but embodiments of the present disclosure are not limited thereto.

Also, when a metal substrate is used as the substrate 11, a supporting member 18 (e.g., see FIG. 2) to be described later may not be used, and the substrate 11 can perform the functions of the substrate and the supporting member 18 at the same time.

When a plastic substrate is used as the substrate 11, it can be a polyimide substrate, but embodiments of the present disclosure are not limited thereto.

When a glass substrate is used as the substrate 11, it can be indium tin oxide (ITO) glass, but embodiments of the present disclosure are not limited thereto.

A brass substrate can be used as the substrate 11 in the ultrasonic sensor 1 according to an embodiment of the present disclosure. When a brass substrate is used as the substrate 11, it can be configured to have a thickness of about 1.0 mm and can implement ultrasonic transmission and reception functions without the configuration of the supporting member 18 described in FIG. 2.

In addition, the ultrasonic sensor 1 according to an embodiment of the present disclosure can be configured without a lower electrode, and thus, an electrical signal can be applied to the piezoelectric member 14 via the substrate 11 in contact with a first wire 43.

The piezoelectric member 14 can be a film-type piezoelectric member 14 including ferroelectric polymers such as polyvinylidene fluoride (PVDF) and polyvinylidene fluoride-trifluoroethylene (PVDF-TrFE) copolymers. In the ultrasonic sensor 1 according to an embodiment of the present disclosure, the piezoelectric member 14 may not be limited to the materials described above, and a material capable of converting electrical energy into mechanical energy by a piezoelectric phenomenon and a reverse piezoelectric phenomenon to generate ultrasonic waves having a predetermined frequency and converting mechanical energy into electrical energy can be used without limitations.

According to an embodiment of the present disclosure, the piezoelectric member 14 can be a compression or elongation film-type piezoelectric member polled in one direction, and according to an embodiment of the present disclosure, the piezoelectric member 14 can have a thickness of 10 to 50 um.

The conductive adhesive member 13 can be disposed between the substrate 11 and the piezoelectric member 14, can adhere the substrate 11 and the piezoelectric member 14, and can be electrically connected the substrate 11 and the piezoelectric member 14 to each other. The conductive adhesive member 13 can include at least one of a silicone-based adhesive, a conductive epoxy adhesive, an insulating epoxy adhesive, and acrylic-based ultraviolet (UV) adhesive, but embodiments of the present disclosure are not limited thereto.

According to an embodiment of the present disclosure, the thickness of the conductive adhesive member 13 can be 5 μm or less. When the thickness of the conductive adhesive member 13 exceeds 5 μm, ultrasonic transmission/reception efficiency can be reduced.

According to an embodiment of the present disclosure, the upper electrode 16 can be an electrode including silver (Ag). For example, when the upper electrode 16 is used as a solid metal including silver (Ag), ultrasonic waves can be attenuated or the intensity of a center frequency can be lowered due to a damping effect of ultrasonic characteristics of the ultrasonic sensor 1 due to a difference in physical properties with the piezoelectric member 14. Therefore, the upper electrode 16 according to an embodiment of the present disclosure can be silver paste (Ag paste). For example, the silver paste can be silver paint or silver epoxy. Here, the silver paint or silver epoxy can be a material including both silver nanoparticles and a binder. The binder may include a resin.

Each of the silver nanoparticles can have a size of 200 nm or less. When the size of the silver nanoparticles is 200 nm or less, the ultrasonic sensor can have transmission and reception performance due to an increase in surface area according to refinement of the silver nanoparticles.

The silver paste can include 90 to 95 wt % of silver nanoparticles and 5 to 10 wt % of a binder. If the silver paste has less than 90 wt % of silver nanoparticles, there can be a problem in that conductivity of the electrode is lowered.

The upper electrode 16 can be prepared by performing a screen printing process or a spraying process on a solvent in which the silver (Ag) paste is diluted, and can be prepared as an ethanol-based solvent (e.g., alcohol solvent) not to use harmful organic solvents such as ketone-based solvents used in a solution process.

Here, the binder can be silver epoxy (Ag Epoxy) or silver paint (Ag paint). Since the upper electrode 16 according to an embodiment of the present disclosure includes silver and a binder, with reference to Table 1 below, acoustic impedance can be lowered depending on a mixing ratio of the silver and the binder and a difference in acoustic impedance with the piezoelectric member 14 positioned below the upper electrode 16 is reduced, thereby improving transmission and reception performance of ultrasonic waves.

TABLE 1

| Material | Density [×10³ kg/m³] | Sound Velocity [m/s] | Acoustic Impedance [×10⁶ kg/m²s] |
|---|---|---|---|
| Air(at 20 C.) | 1.24 × 10⁻³ | 344 | 427 |
| PVDF | 1.78 | 2260 | 4.02 |
| Copper(Cu) | 8.93 | 5010 | 44.6 |
| Silver(Ag) | 10.6 | 3600 | 38 |
| Silver epoxy | 2.71 | 1900 | 5.14 |
| Silver paint | 3.4 | 3600 | 12.24 |
| Silicone Adhesive | 1.47 | 960 | 1.41 |
| Polyimide film | 1.421 | 2414 | 3.4 |

Therefore, when the upper electrode 16 includes silver (Ag) paste, the upper electrode 16 can be finally configured as a composite structure including silver (Ag) particles and the binder after undergoing coating and drying processes based on the solution described above.

Alternatively, according to another embodiment of the present disclosure, the upper electrode 16 can be prepared through a screen printing process or a spraying process based on a solvent-free without a solvent.

If the upper electrode 16 uses a ketone-based solvent and the piezoelectric member 14 uses a film-type PVDF-based material, physical deformation of the piezoelectric member may occur during drying process of the upper electrode, which may cause a limitation in that adhesion force to an object to which the ultrasonic sensor is attached may be weakened.

A thickness of the upper electrode 16 can be 10 µm or less. If the thickness of the upper electrode exceeds 10 µm, an ultrasonic attenuation effect by the upper electrode may increase, and as a result, the transmission and reception performance of the ultrasonic sensor may be deteriorated or lowered.

In addition, if the thickness of the upper electrode exceeds 10 µm, a ripple phenomenon that is divided into two bands in a portion where ultrasonic radiation energy of a frequency response is the maximum may occur, and as a result, the transmission and reception performance of the ultrasonic sensor may be deteriorated or lowered.

The surface roughness of the upper electrode 16 can be 0.01 µm or less. Here, the surface of the upper electrode 16 can be an upper surface toward a user 3 (e.g., a finger of the user 3).

The upper electrode 16 according to t an embodiment of the present disclosure can have a surface roughness of 0.01 µm or less and can be configured to have a flat surface. The ultrasonic sensor according to an embodiment of the present disclosure includes the upper electrode 16 having an upper surface with low surface roughness, so that scattering in a random direction occurring on the surface of the upper electrode 16 may be reduced. Therefore, since the ultrasonic sensor 1 according to an embodiment of the present disclosure includes the upper electrode 16 with the surface roughness of 0.01 µm or less, loss due to surface scattering of the upper electrode 16 can be reduced when the ultrasonic waves generated by the piezoelectric member 14 or ultrasonic waves reflected from the user 3 are received.

According to an embodiment of the present disclosure, the ultrasonic sensor 1 can further include an ultrasonic sensor controller 4 configured to control the ultrasonic sensor 1.

The ultrasonic sensor controller 4 can include an ultrasonic sensor intergrated circuit 41 and a flexible printed circuit 42, and can include a first wire 43 and a second wire 44 configured to apply a signal to the ultrasonic sensor 1 through the flexible printed circuit 42.

The ultrasonic sensor intergrated circuit 41 can be electrically connected to the ultrasonic sensor 1 to control the driving of the ultrasonic sensor 1 and read or decode a fingerprint pattern of the user 3 recognized by the ultrasonic sensor 1. The ultrasonic sensor intergrated circuit 41 can be provided in a form integrating a fingerprint sensor driving unit for configured to drive the ultrasonic sensor 1 and a readout intergrated circuit for reading or decoding user biometric information detected by the ultrasonic sensor 1 and outputting it as a digital value. The ultrasonic sensor intergrated circuit 41 can be electrically connected to the ultrasonic sensor 1 to control generation and reception of ultrasonic waves during a first operation period configured to generate ultrasonic waves and a second operation period configured to receive ultrasonic waves, and analyze data of the received reflected ultrasonic waves to recognize a fingerprint.

The flexible printed circuit 42 can be electrically connected to the ultrasonic sensor intergrated circuit 41 and the ultrasonic sensor 1, and the flexible printed circuit 42 can have a predetermined circuit pattern formed thereon and can be formed of heat-resistant plastics including polyimide and polyester which are flexible materials.

The first wire 43 may be disposed at a rear surface of the substrate 11 and can be disposed to at least partially overlap the substrate 11. When the ultrasonic sensor 1 includes a plurality of pixels, the ultrasonic sensor 1 may include a plurality of first wires 43 for independently driving each of the plurality of pixels.

The second wire 44 may be disposed at an upper surface of the piezoelectric member 14 and can be disposed to be electrically connected to the upper electrode 16. The second wire 44 may include a plurality of second wires 44 for independently driving each of a plurality of pixels when the ultrasonic sensor 1 includes the plurality of pixels.

An array structure of the first wire 43 and the second wire 44 will be described later with reference to FIGS. 3A and 3B.

According to an embodiment of the present disclosure, the first wire 43 and the second wire 44 can be formed of a copper tape having high electrical conductivity, but embodiments of the present disclosure are not limited thereto.

According to an embodiment of the present disclosure, the ultrasonic sensor 1 can further include a platen 2 configured to cover the ultrasonic sensor 1 and the ultrasonic sensor controller 4. The platen 2 can be a cover substrate exposed outwardly toward the user of the ultrasonic sensor 1. As illustrated in FIG. 1, a body of the user 3 can come into contact with an upper surface of the platen 2. Here, the body of the user 3 can be a fingerprint of a finger including recognition information of the user 3.

The platen 2 may not be essential for the configuration of the ultrasonic sensor 1 according to an embodiment of the present disclosure, and can be omitted when the ultrasonic sensor 1 according to an embodiment of the present disclosure is attached to another electronic apparatus or an object and used.

The piezoelectric member 14 can output ultrasonic waves to the front or rear of the piezoelectric member 14 when ultrasonic waves are transmitted by driving the ultrasonic sensor to be described later. Ultrasonic waves output to the front of the piezoelectric member 14 can be output to the outside of the platen 2 through predetermined reflection, transmission, and absorption while passing through other components or medium disposed at an upper portion of the piezoelectric member.

Figure 2:
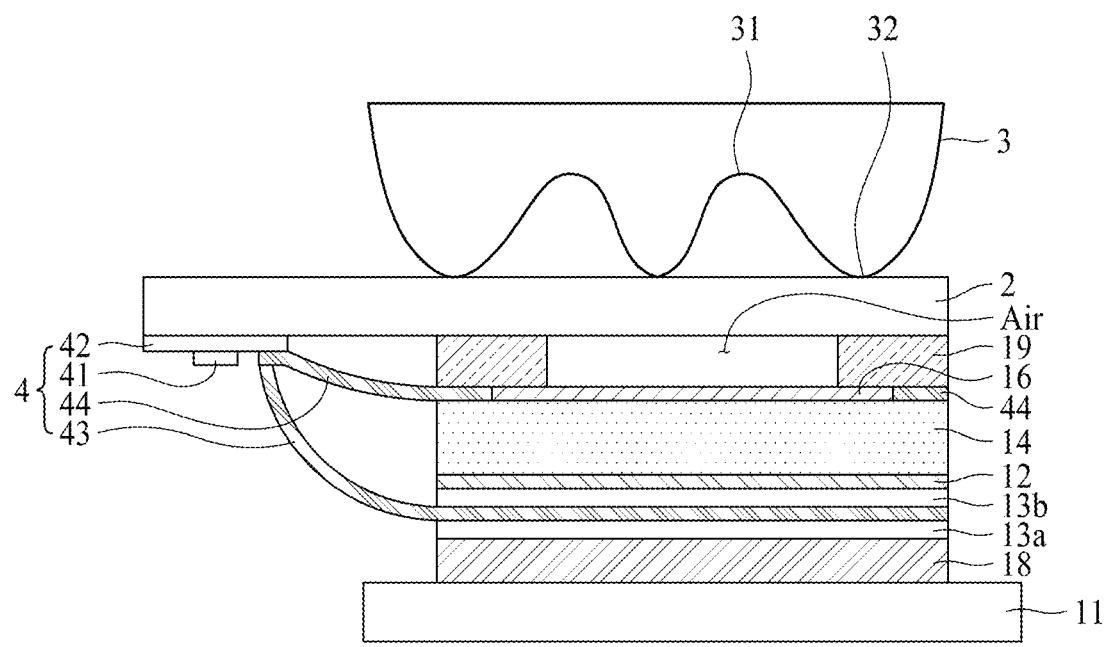
FIG. 2 is a cross-sectional view of an ultrasonic sensor according to another embodiment of the present disclosure.

FIG. 2 illustrates an ultrasonic sensor according to another embodiment of the present disclosure.

With reference to FIG. 2, the ultrasonic sensor according to another embodiment of the present disclosure can include a substrate 11, a supporting member 18, conductive adhesive members 13a and 13b, a lower electrode 12, a piezoelectric member 14, an upper electrode 16, and a counter substrate 19, and the ultrasonic sensor according to another embodiment of the present disclosure can further include the lower electrode 12, the plurality of conductive adhesive members 13a and 13b, and the counter substrate 19, compared with the ultrasonic sensor 1 according to an embodiment of the present disclosure in FIG. 1. In the ultrasonic sensor 1 according to another embodiment of the present disclosure, the conductive adhesive member 13a, the piezoelectric member 14, and the upper electrode 16 described in FIG. 1 can be prepared as the same components. Therefore, a repeated description may be omitted or may be briefly provided.

A plastic substrate can be used as the substrate 11 in the ultrasonic sensor 1 according to another embodiment of the present disclosure. When a plastic substrate is used as the substrate 11, it can be prepared as a polyimide substrate having a thickness of about 0.2 mm.

In addition, in the ultrasonic sensor 1 according to another embodiment of the present disclosure, when the supporting member 18, the lower electrode 12, the piezoelectric member 14, and the upper electrode 16 are adjusted to have horizontal and vertical dimensions smaller than the substrate 11, the supporting member 18, the lower electrode 12, the piezoelectric member 14, and the upper electrode 16 can be arranged to be aligned at the center of the substrate 11.

The lower electrode 12 can be configured to be the same as the upper electrode 16 described with reference to FIG. 1.

Therefore, when the lower electrode 12 includes silver (Ag), a silver (Ag) paste including silver (Ag) nanoparticles, a solvent, a binder, etc. can be prepared through a screen printing process or a spray process and can be prepared as an ethanol-based solvent in order not to use a harmful organic solvent such as a ketone-based solvent.

Therefore, when the lower electrode 12 includes a silver (Ag) paste, the lower electrode 12 can be configured finally as a composite structure including a silver (Ag) paste and a binder after undergoing a coating and drying process based on the solution described above.

Alternatively, according to another embodiment of the present disclosure, the lower electrode 12 can be configured through a screen printing process or a spraying based on a solvent-free without a binder.

In addition, the ultrasonic sensor according to an embodiment of the present disclosure can further include a supporting member 18. When the substrate 11 of the ultrasonic sensor 1 is configured to include a metal, the supporting member 18 can be omitted or may be briefly provided.

The supporting member 18 can include a metal and can include at least one of brass and aluminum (Al), but embodiments of the present disclosure are not limited thereto.

For example, the supporting member 18 can be an aluminum plate of about 0.2 mm, and can be prepared to have horizontal and vertical dimensions corresponding to the piezoelectric member 14.

In addition, when aluminum is used as the supporting member 18, a black anodizing treatment can be additionally performed on the supporting member 18. Here, the black anodizing can be stained a black with anodizing.

The supporting member 18 can be positioned between the substrate 11 and the piezoelectric member 14 and can have a size corresponding to the piezoelectric member 14.

According to another embodiment of the present disclosure, the ultrasonic sensor 1 can further include an ultrasonic sensor controller 4 configured to control the ultrasonic sensor 1.

The ultrasonic sensor controller 4 can include an ultrasonic sensor intergrated circuit 41 and a flexible printed circuit 42, and can include a first wire 43 and a second wire 44 configured to apply a signal to the ultrasonic sensor 1 through the flexible printed circuit 42.

Here, the first wire 43 can be electrically connected to the lower electrode 12 through a second conductive adhesive member 13b, and the second wire 44 can be disposed to surround the upper electrode 16. Accordingly, the ultrasonic sensor 1 according to another embodiment of the present disclosure can have a structure in which the upper electrode 16 is exposed at the uppermost portion.

The ultrasonic sensor according to another embodiment of the present disclosure can further include a counter substrate 19. The counter substrate 19 can be disposed on the upper electrode 16 and the second wire 44 and can be prepared in a form in which a region corresponding to an area of the piezoelectric member 14 or the upper electrode 16 is open. Accordingly, a predetermined air layer can be present on the upper portion of the upper electrode 16. The counter substrate 19 can be adjusted to have the same thickness as that of the substrate 11, but the thickness of the counter substrate 19 is not limited to the same thickness as that of the substrate 11.

In the ultrasonic sensor according to an embodiment and another embodiments of the present disclosure, a signal received after an ultrasonic wave is transmitted can be detected as 6 dB (decibel) or higher.

The ultrasonic sensor according to an embodiment and another embodiments of the present disclosure can be driven as follows.

During a first operation period (ultrasonic wave generation period), an alternating current (AC) voltage can be applied to at least one of the first wire 43 and the second wire 44 by the ultrasonic sensor controller 4, and ultrasonic waves having a predetermined frequency range can be generated according to contraction and expansion based on a piezoelectric effect of the piezoelectric member 14. The ultrasonic waves can be output to an upper surface or a lower surface of the piezoelectric member 14, and ultrasonic waves emitted to the upper surface of the piezoelectric member 14 can come into contact with the fingerprint of the user 3 to generate a predetermined reflected ultrasonic wave.

During a second operation period (ultrasonic detection period), the ultrasonic wave reflected by the user 3's fingerprint or other medium can reach the piezoelectric member 14 and the piezoelectric effect is reversible, and thus, when a certain ultrasonic wave is applied to the piezoelectric member 14, a voltage can be generated according to vibrations and the generated voltage can be recognized as a fingerprint pattern by the ultrasonic sensor controller 4. In the ultrasonic sensor of FIGS. 1 and 2, since the piezoelectric member 14 simultaneously acts as an ultrasonic transmitter and an ultrasonic receiver, the piezoelectric member 14 can be referred to as a transceiver.

Here, the fingerprint of the user 3 can be formed with a line so that it has a unique pattern of an individual including a valley 31 and a ridge 32 or a plurality of valleys 31 and ridges 32. When the user 3 (e.g., part of the user's finger) contacts the platen 2 for fingerprint recognition, the ultrasonic sensor 1 recognizes the contact of the user 3 when the fingerprint of the user 3 having the valley 31 and the ridge 32 contacts one surface of the cover platen 2, outputs an ultrasonic wave to the user, and recognize a fingerprint based on an impedance value of the reflected ultrasonic wave.

According to an embodiment of the present disclosure, the ultrasonic wave generated by the piezoelectric member 14 can be a plane wave traveling parallel to one surface of the piezoelectric member 14 provided in a plate shape, and can be a diffusion wave radially diffused to travel without directionality.

Figure 3A:
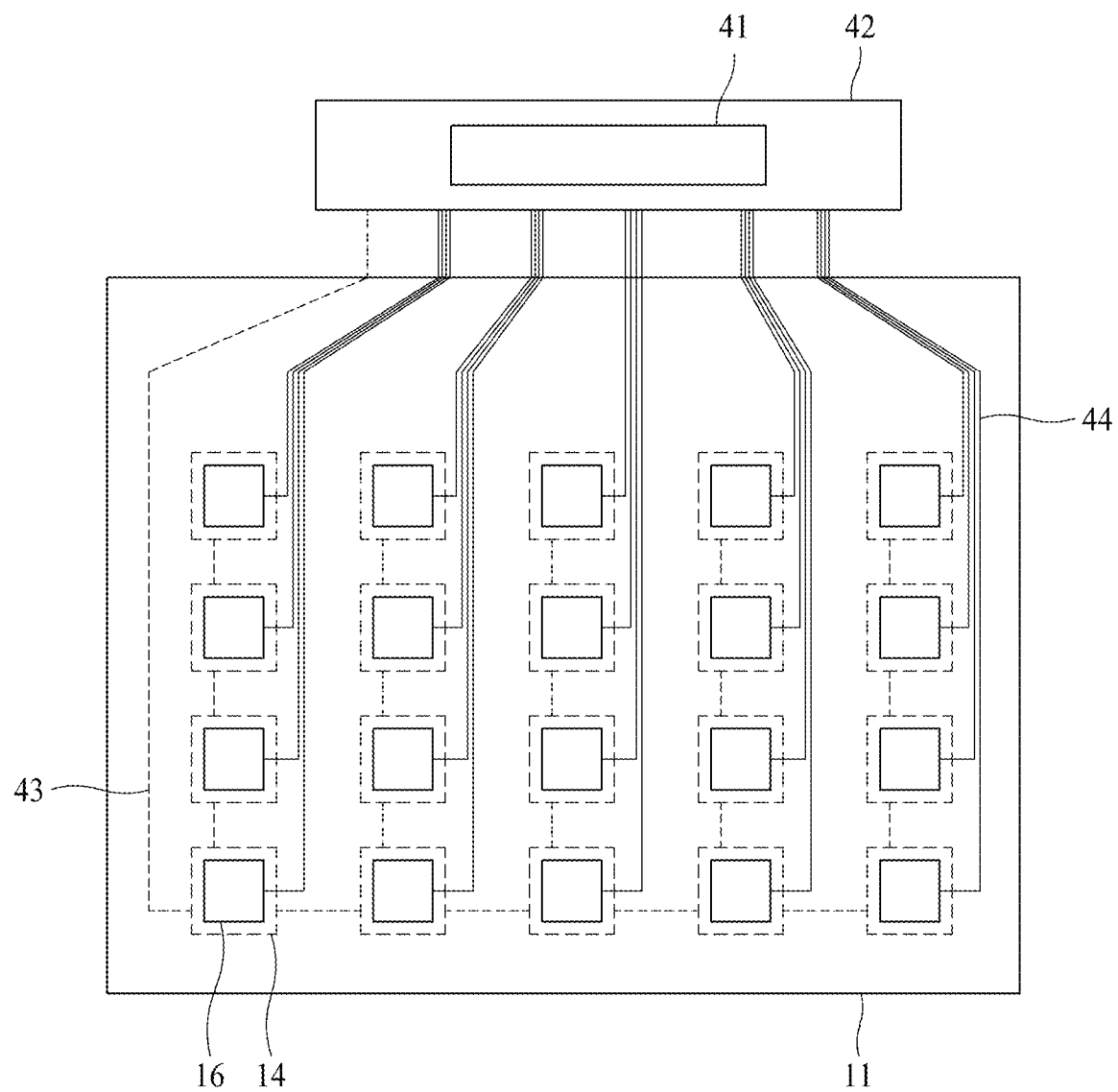
FIGS. 3A and 3B illustrate an array structure of an ultrasonic sensor according an embodiment of to the present disclosure.
Figure 3B:
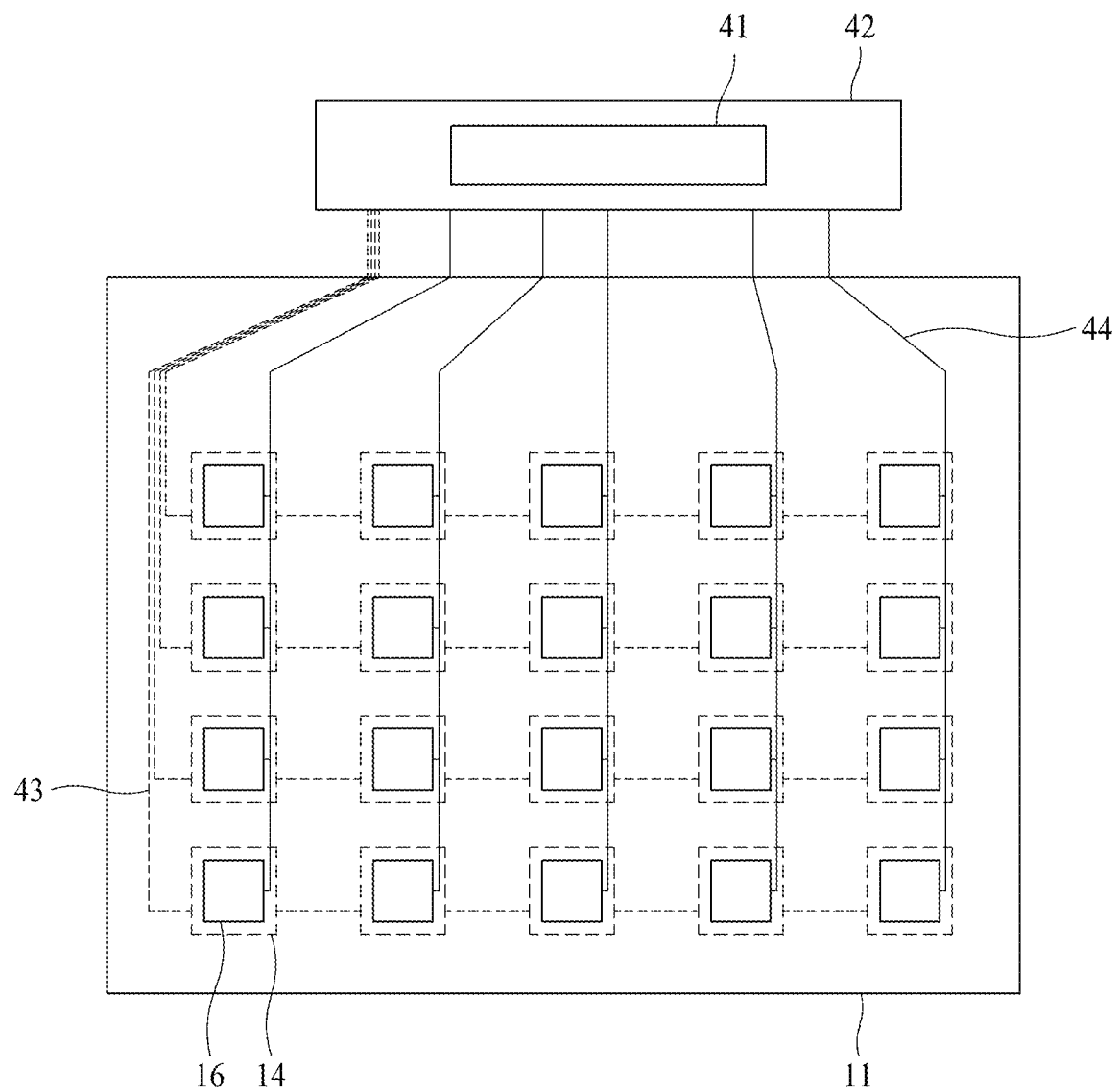

FIGS. 3A and 3B illustrate an array structure of the ultrasonic sensor of FIGS. 1 and 2.

With reference to FIGS. 3A and 3B, the ultrasonic sensor 1 including the piezoelectric member 14 and the upper electrode 16 can have an array structure in which a plurality of ultrasonic sensors are arranged to configure a plurality of ultrasonic sensor picture structures on the substrate 11.

As illustrated in FIG. 3A, the first wire 43 can be configured as a common wire electrically connected in common to the plurality of ultrasonic sensors 1 or the plurality of piezoelectric members 14. The second wire 44 can be configured to be individually connected to each of the plurality of ultrasonic sensors 1 or the plurality of upper electrodes 16.

As illustrated in FIG. 3B, the first wire 43 can be configured as a common wire electrically commonly connected for each of a plurality of ultrasonic sensors 1 or a plurality of piezoelectric members 14 aligned side by side in one direction (X). The second wire 44 can be configured as a common wire electrically commonly connected for each of a plurality of ultrasonic sensors 1 or a plurality of piezoelectric members 14 aligned side by side in another direction (Y) perpendicular to one direction (X) in which the first wire is arranged. The array structure of the first wire 43 and the second wire 44 of the present disclosure is not limited thereto.

Figure 4:
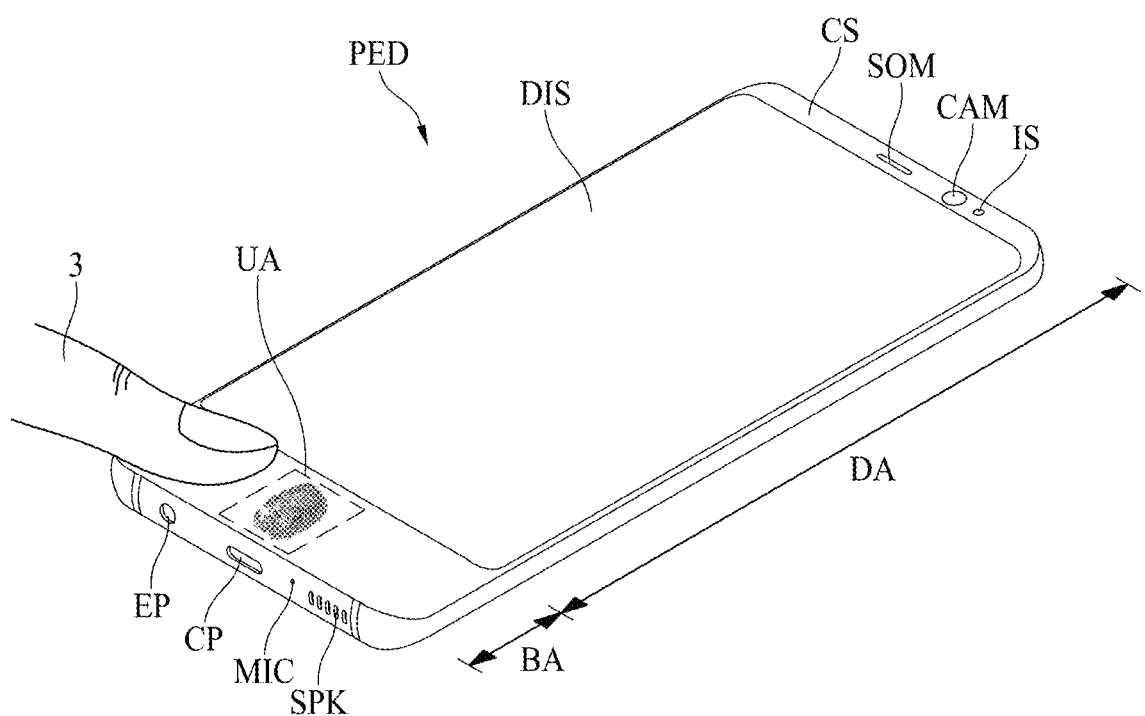
FIG. 4 is a perspective view of a portable electronic apparatus including an ultrasonic sensor area.
Figure 5:
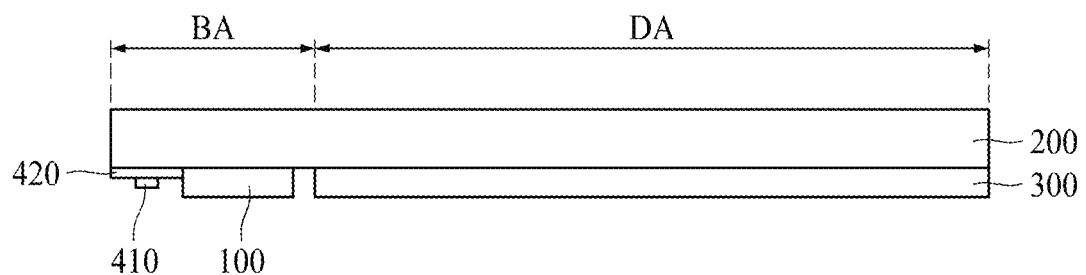
FIG. 5 is a cross-sectional view of a portable electronic apparatus.

FIG. 4 is a perspective view of a portable electronic apparatus including an ultrasonic sensor region, and FIG. 5 is a cross-sectional view of the portable electronic apparatus.

With reference to FIG. 4, a portable electronic apparatus PED can include a case CS, a display apparatus DIS, a sound output device SOM, an image sensor CAM, an illuminance sensor IS, a speaker SPK, a microphone MIC, an earphone port EP, and a charging port CP. The portable electronic apparatus PED can include a cover member 200 exposed toward the user 3, an ultrasonic sensor 100 disposed at a rear surface of the cover member 200, an ultrasonic sensor controller 400, and a display device 300.

The portable electronic apparatus PED can include a display area DA overlapping the display apparatus DIS and a bezel area BA in which an ultrasonic sensor area UA is disposed. When the ultrasonic sensor area UA is configured to detect a user's fingerprint, the ultrasonic sensor area UA can be adjusted to a wide rectangle shape of 20 mm in width and 10 mm in long in consideration of a size of the user's fingerprint, but the dimensions of the ultrasonic sensor area UA of the present disclosure are not limited thereto, and non-limited structures having various dimensions such as circular, oval, and polygonal shapes can be applied.

Although the ultrasonic sensor area UA is illustrated to be formed in the bezel area BA of a front surface of the portable electronic apparatus PED in FIG. 4, a position of the ultrasonic sensor area UA is not limited thereto. For example, the ultrasonic sensor area UA can be disposed at at least a portion or the entire region of the display apparatus DIS and at least a portion or the entire area of the case CS of the rear surface of the portable electronic apparatus PED.

Although the portable electronic apparatus PED is illustrated as being a smartphone, it may not be limited thereto. For example, the portable electronic apparatus according to an embodiment of the present disclosure can be a tablet or a notebook computer. Further, the display apparatus according to an embodiment of the present disclosure can be applied to various electronic apparatuses such as a monitor (e.g., in vehicles or other transportation means) and a television (TV) as well as a portable electronic apparatus PED.

The case CS can be formed to cover one or more of a front surface, a side surface, and a rear surface of the portable electronic apparatus PED. The case CS can be formed of plastic. The display apparatus DIS, the sound output device SOM, the image sensor CAM, and the illuminance sensor IS can be disposed at the front surface of the case CS. The microphone MIC, the earphone port EP, and the charging port CP can be disposed on one side surface of the case CS.

The display apparatus DIS may occupy most of the front surface of the portable electronic apparatus PED. A portion of the display apparatus DIS not covered by the case CS can overlap a display area of the display apparatus DIS, and the case CS can overlap a non-display area of the display apparatus DIS.

The sound output device SOM may be a receiving device that outputs a voice of a counterpart during a call with the counterpart. The image sensor CAM is a device configured to capture an image seen on the front of the portable electronic device PED, and another image sensor can be additionally disposed at the rear surface of the portable electronic apparatus PED. The illuminance sensor IS is a device configured to adjust luminance of the display apparatus DIS by detecting the amount of incident light. The microphone MIC is a transmitting device configured to convert a sound wave of a user's voice into an electric signal during a call with the counterpart and transmitting the converted electrical signal. The speaker SPK outputs a sound signal related to a function or application performed by the portable electronic apparatus PED. The earphone port EP is a port configured to output a sound signal to an earphone instead of the speaker SPK when the earphone is inserted or accommodated. The charging port CP is a port to which a charger configured to charge a battery of the portable electronic apparatus PED is connected.

FIG. 5 is a cross-sectional view of a display apparatus including an ultrasonic sensor according to an embodiment of the present disclosure.

With reference to FIG. 5, the portable electronic apparatus PED according to an embodiment of the present disclosure can include a cover member 200, a display device 300, an ultrasonic sensor 100, and an ultrasonic sensor controller 400.

The cover member 200 can include any one of sapphire glass and gorilla glass or a stacked structure thereof. A plastic substrate having a predetermined strength can also be used but embodiments of the present disclosure are not limited thereto. In addition, as previously illustrated in FIG. 4, a body of the user 3 can come into contact with the upper surface of the cover member 200. Here, the body of the user 3 can be a fingerprint of a finger including recognition information of the user 3.

The display device 300 may be a display apparatus that displays a predetermined image. For example, the display device 300 can include an organic light emitting diode (OLED), but embodiments of the present disclosure are not limited thereto. For example, the display device 300 can be configured as a liquid crystal display or a quantum dot light emitting display in addition to an organic light emitting display.

The ultrasonic sensor 100 and the ultrasonic sensor controller 400 can be disposed to overlap the ultrasonic sensor area UA of the bezel area BA. A detailed configuration of the ultrasonic sensor 100 and the ultrasonic sensor controller 400 is described later with reference to FIGS. 6 and 7.

Figure 6:
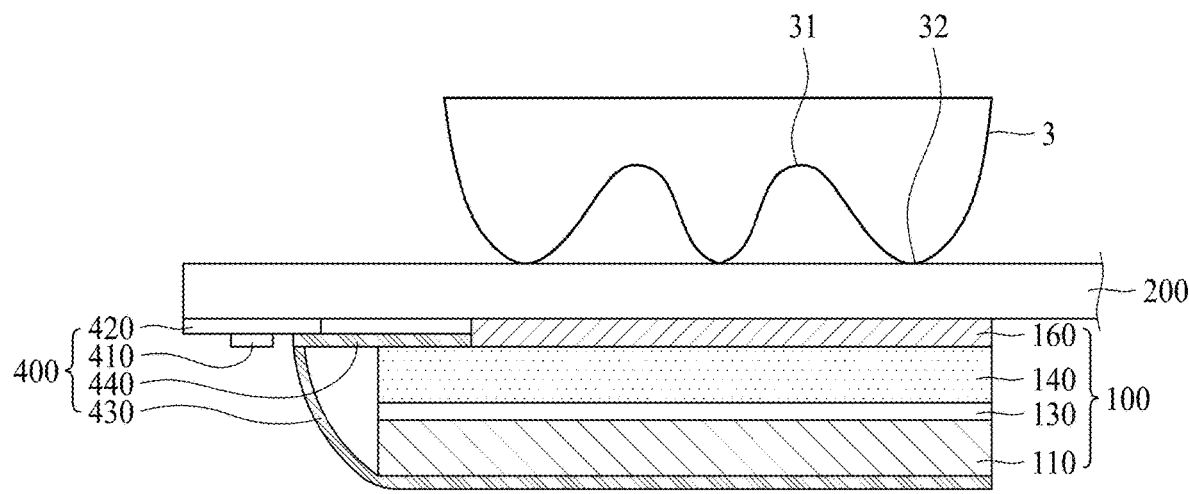
FIGS. 6 and 7 illustrate a display apparatus including an ultrasonic sensor according to an embodiment of the present disclosure and another embodiment of the present disclosure.
Figure 7:
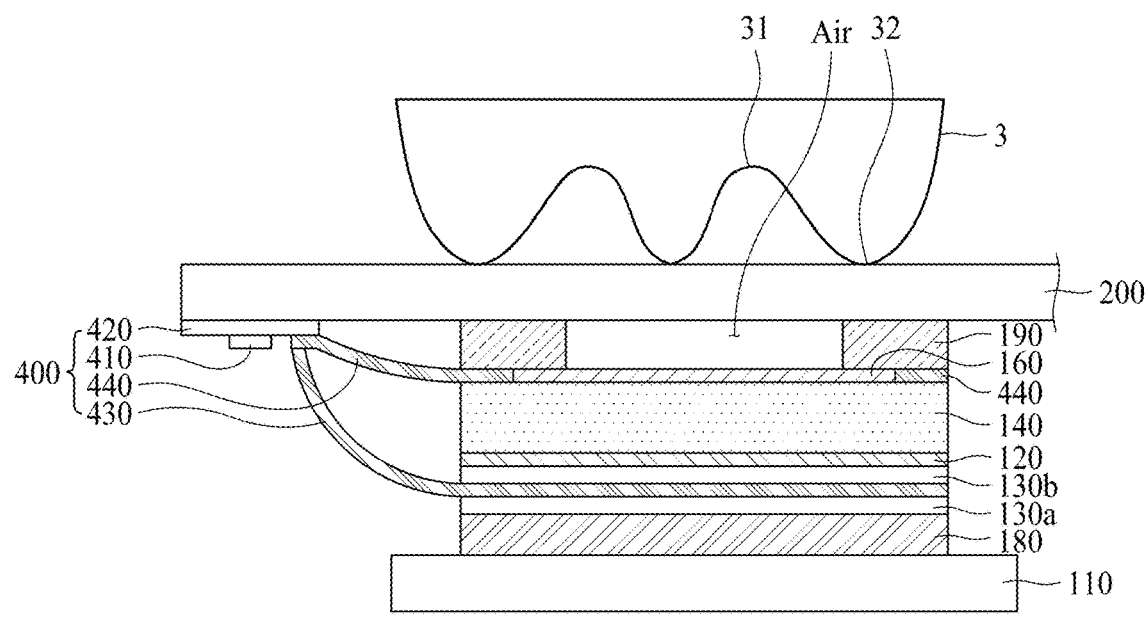

FIGS. 6 and 7 illustrate a display apparatus according to an embodiment of the present disclosure and another embodiment of the present disclosure.

With reference to FIG. 6, the display apparatus according to an embodiment of the present disclosure can include a cover member 200, an ultrasonic sensor 100 disposed at a rear surface of the cover member 200, and an ultrasonic sensor controller 400.

The ultrasonic sensor 100 according to an embodiment of the present disclosure includes a piezoelectric member 140, an upper electrode 160 disposed at an upper surface of the piezoelectric member 140, a substrate 110 configured to support the piezoelectric member 140, and a conductive adhesive member 130 disposed between the piezoelectric member 140 and the substrate 110.

The substrate 110 can be at least one of a metal substrate, a plastic substrate, and a glass substrate.

When a metal substrate is used as the substrate 110, the substrate can include at least one of a brass substrate and an aluminum substrate, but embodiments of the present disclosure are not limited thereto.

When a metal substrate is used as the substrate 110, the supporting member 180 to be described later may not be used, and the substrate 110 can simultaneously perform functions of the substrate and the supporting member 180.

When a plastic substrate is used as the substrate 110, the substrate can be a polyimide substrate, embodiments of the present disclosure are not limited thereto.

When a glass substrate is used as the substrate 110, the substrate can be indium tin oxide (ITO) glass, embodiments of the present disclosure are not limited thereto.

A brass substrate can be used as the substrate 110 in the ultrasonic sensor 100 according to an embodiment of the present disclosure. When a brass substrate is used as the substrate 110, the substrate can be provided to have a thickness of about 1.0 mm and implement the ultrasonic transmission and reception functions without the configuration of the supporting member 180 described in FIG. 7.

In addition, the ultrasonic sensor 100 according to an embodiment of the present disclosure can be configured without a lower electrode, and accordingly, an electrical signal can be applied to the piezoelectric member 140 by the medium of the substrate 110 in contact with the first wire 430.

The piezoelectric member 140 can be a film-type piezoelectric member 140 including ferroelectric polymers such as polyvinylidene fluoride (PVDF) and polyvinylidene fluoride-trifluoroethylene (PVDF-TrFE) copolymers. In the ultrasonic sensor 100 according to an embodiment of the present disclosure, the piezoelectric member 140 is not limited to the materials described above, and a material capable of converting electrical energy into mechanical energy by a piezoelectric phenomenon and a reverse piezoelectric phenomenon to generate ultrasonic waves having a predetermined frequency and converting mechanical energy into electrical energy can be used without limitations.

The piezoelectric member 140 can output ultrasonic waves to the front or rear of the piezoelectric member 140 when ultrasonic waves are transmitted by driving an ultrasonic sensor to be described later. Ultrasonic waves output to the front of the piezoelectric member 140 can be output to the outside of the counter substrate 190 through predetermined reflection, transmission, and absorption, while passing through other components or medium disposed at an upper portion of the piezoelectric member.

According to an embodiment of the present disclosure, the piezoelectric member 140 can be a compressed or stretched (or elongated) film-type piezoelectric member which is subjected to polling in one direction.

The conductive adhesive member 130 can be disposed between the substrate 110 and the piezoelectric member 140, can attach the substrate 110 and the piezoelectric member 140, and electrically connect the substrate 110 and the piezoelectric member 140. The conductive adhesive member 130 can include at least one of a silicone-based adhesive, a conductive epoxy adhesive, an insulating epoxy resin, and an acrylic-based ultraviolet (UV) adhesive, but embodiments of the present disclosure are not limited thereto.

According to an embodiment of the present disclosure, the thickness of the conductive adhesive member 130 can be 5 μm or less. If the thickness of the conductive adhesive member 130 exceeds 5 μm, ultrasonic transmission/reception efficiency can be lowered.

According to an embodiment of the present disclosure, the upper electrode 160 can be an electrode including silver (Ag). For example, when the upper electrode 160 includes silver (Ag) and is used as a solid metal, ultrasonic waves can be attenuated or the intensity of a center frequency can be lowered due to a damping effect of ultrasonic characteristics of the ultrasonic sensor 100 due to a difference in physical properties with the piezoelectric member 140. Therefore, the upper electrode 160 according to an embodiment of the present disclosure can be silver paste (Ag paste). For example, the silver paste can be silver paint or silver epoxy. Here, the silver paint or silver epoxy can be a material including both silver nanoparticles and a binder.

The silver nanoparticles can have a size of 200 nm or less. When the size of the silver nanoparticles is 200 nm or less, the ultrasonic sensor can have transmission and reception performance due to an increase in surface area according to refinement of the silver nanoparticles.

The silver paste can include 90 to 95 wt % of silver nanoparticles and 5 to 10 wt % of a binder. If the silver paste has less than 90 wt % of silver nanoparticles, there can be a problem in that conductivity of the electrode is lowered.

The upper electrode 160 can be prepared by performing a screen printing process or a spraying process on a solvent in which the silver (Ag) paste is diluted, and can be prepared as an ethanol-based solvent not to use harmful organic solvents such as ketone-based solvents.

Here, the binder can be silver epoxy (Ag Epoxy) or silver paint (Ag paint). Since the upper electrode 160 according to an embodiment of the present disclosure includes silver and a binder, with reference to Table 1 above, acoustic impedance can be lowered depending on a mixing ratio of the silver and the binder and a difference in acoustic impedance with the piezoelectric member 140 positioned below the upper electrode 160 is reduced, thereby improving transmission and reception performance of ultrasonic waves.

Therefore, when the upper electrode 160 includes silver (Ag) paste, the upper electrode 160 can be finally configured as a composite structure including silver (Ag) particles and the binder after undergoing coating and drying processes based on the solution described above.

Alternatively, according to another embodiment of the present disclosure, the upper electrode 160 can be prepared through a screen printing process based on a solvent-free without a solvent.

If the upper electrode 160 uses a ketone-based solvent and the piezoelectric member 140 uses a film-type PVDF-based material, physical deformation of the piezoelectric member can occur during drying of the upper electrode, which can cause a problem in that adhesion force to an object to which the ultrasonic sensor is attached can be weakened.

A thickness of the upper electrode 160 can be 10 μm or less. If the thickness of the upper electrode exceeds 10 μm, an ultrasonic attenuation effect by the upper electrode may increase, and as a result, the transmission and reception performance of the ultrasonic sensor may be deteriorated or lowered.

In addition, if the thickness of the upper electrode exceeds 10 μm, a ripple phenomenon that is divided into two bands in a portion where ultrasonic radiation energy of a frequency response is the maximum may occur, and as a result, the transmission and reception performance of the ultrasonic sensor can be deteriorated or lowered.

The surface roughness of the upper electrode 160 can be 0.01 μm or less. Here, a surface of the upper electrode 160 can be an upper surface toward a user 3.

The upper electrode 160 according to an embodiment of the present disclosure can have a surface roughness of 0.01 μm or less, and can be prepared to have a flat surface. The ultrasonic sensor according to an embodiment of the present disclosure includes the upper electrode 160 having an upper surface with low surface roughness, so that scattering in a random direction occurring on the surface of the upper electrode 160 can be reduced. Therefore, since the ultrasonic sensor 100 according an embodiment of to the present disclosure includes the upper electrode 160 with surface roughness of 0.01 μm or less, loss due to surface scattering of the upper electrode 160 can be reduced when ultrasonic waves generated by the piezoelectric member 140 or ultrasonic waves reflected from the user 3 are received.

According to an embodiment of the present disclosure, the ultrasonic sensor 100 can further include an ultrasonic sensor controller 400 configured to control the ultrasonic sensor 100.

The ultrasonic sensor controller 400 can include an ultrasonic sensor intergrated circuit 410 and a flexible printed circuit 420, and can include a first wire 430 and a second wire 440 configured to apply a signal to the ultrasonic sensor 100 through the flexible printed circuit 420.

The ultrasonic sensor intergrated circuit 410 can be electrically connected to the ultrasonic sensor 100 to control the driving of the ultrasonic sensor 100 and read a fingerprint pattern of the user 3 recognized by the ultrasonic sensor 100. The ultrasonic sensor intergrated circuit 410 can be provided in a form integrating a fingerprint sensor driving unit configured to drive the ultrasonic sensor 100 and a readout intergrated circuit configured to read (or decode) user biometric information detected by the ultrasonic sensor 100 and outputting it as a digital value. The ultrasonic sensor intergrated circuit 410 can be electrically connected to the ultrasonic sensor 100 to control generation and reception of ultrasonic waves during a first operation period configured to generate ultrasonic waves and a second operation period configured to receive ultrasonic waves, and analyze data of the received reflected ultrasonic waves to recognize a fingerprint.

The flexible printed circuit 420 can be electrically connected to the ultrasonic sensor intergrated circuit 410 and the ultrasonic sensor 100, and the flexible printed circuit 420 can have a predetermined circuit pattern formed on the flexible printed circuit 420 and can be formed of heat-resistant plastics including polyimide and polyester which are flexible materials.

The first wire 430 can be disposed at the rear surface of the substrate 110. When the ultrasonic sensor 100 includes a plurality of pixels, the first wire 430 can include a plurality of first wire 430 for independently driving each of the plurality of pixels.

The second wire 440 can be disposed at an upper surface of the piezoelectric member 140 and can be disposed to be electrically connected to the upper electrode 160. The second wire 440 can include a plurality of second wires 440 for independently driving each of a plurality of pixels when the ultrasonic sensor 100 includes the plurality of pixels.

According to an embodiment of the present disclosure, the first wire 430 and the second wire 440 can be formed of a copper tape having high electrical conductivity, but embodiments of the present disclosure are not limited thereto.

The piezoelectric member 140 can output ultrasonic waves to the front or rear of the piezoelectric member 140 when ultrasonic waves are generated by driving the ultrasonic sensor to be described later. Ultrasonic waves output to the front of the piezoelectric member 140 can be output to the outside of the cover member 200 through predetermined reflection, transmission, and absorption while passing through other components or medium disposed at an upper portion of the piezoelectric member.

With reference to FIG. 7, a display apparatus including an ultrasonic sensor according to another embodiment of the present disclosure can include a cover member 200, an ultrasonic sensor 100 disposed at a rear surface of the cover member 200, and an ultrasonic sensor controller 400. Since only a configuration of the ultrasonic sensor 100 is changed in the display apparatus including the ultrasonic sensor according to another embodiment of the present disclosure of FIG. 7, compared to an embodiment of the present disclosure of FIG. 6 described above, the changed configuration is mainly described below.

The ultrasonic sensor of the display apparatus according to another embodiment of the present disclosure can include a substrate 110, a supporting member 180, conductive adhesive members 130a and 130b, a lower electrode 120, a piezoelectric member 140, an upper electrode 160, and a counter substrate 190, and can further include a lower electrode 120, a supporting member 180, and a plurality of conductive adhesive members 130a and 130b, and a counter substrate 190, compared to the ultrasonic sensor 100 described in FIG. 6. Therefore, a repeated description may be omitted or may be briefly provided.

Here, the substrate 110 can be a plastic substrate. When a plastic substrate is used as the substrate 110, the substrate can be prepared as a polyimide substrate having a thickness of about 0.2 mm.

The lower electrode 120 can be prepared in the same manner as the upper electrode 160 described with reference to FIG. 6.

Therefore, when the lower electrode 120 includes silver (Ag), a silver (Ag) paste including silver (Ag) nanoparticles, a solvent, a binder, etc. can be prepared through a screen printing process or a spray process and can be prepared as an ethanol-based solvent in order not to use a harmful organic solvent such as a ketone-based solvent.

Therefore, when the lower electrode 120 includes a silver (Ag) paste, the lower electrode 120 can be configured finally as a composite structure including a silver (Ag) paste and a binder after undergoing a coating and drying process based on the solution described above.

Alternatively, according to another embodiment of the present disclosure, the lower electrode 120 can be prepared through a screen printing process or a spraying based on a solvent-free without a binder.

The supporting member 180 can include a metal and can include at least one of brass and aluminum, but embodiments of the present disclosure are not limited thereto.

For example, the supporting member 180 can be an aluminum plate of about 0.2 mm, and can be prepared to have horizontal and vertical dimensions corresponding to the piezoelectric member 140.

In addition, when aluminum is used as the supporting member 180, a black anodizing treatment can be additionally performed on the supporting member 180. Here, the black anodizing can be stained a black with anodizing.

According to another embodiment of the present disclosure, the ultrasonic sensor 100 can further include an ultrasonic sensor controller 400 configured to control the ultrasonic sensor 100.

The ultrasonic sensor controller 400 can include an ultrasonic sensor intergrated circuit 410 and a flexible printed circuit 420, and can include a first wire 430 and a second wire 440 configured to apply a signal to the ultrasonic sensor 1 through the flexible printed circuit 420.

Here, the first wire 430 can be electrically connected to the lower electrode 120 through a second conductive adhesive member 130b, and the second wire 440 can be disposed to surround the upper electrode 160. Accordingly, the ultrasonic sensor 100 according to another embodiment of the present disclosure can have a structure in which the upper electrode 160 is exposed the uppermost portion.

The ultrasonic sensor according to another embodiment of the present disclosure can further include a counter substrate 190. The counter substrate 190 can be disposed on the upper electrode 160 and the second wire 440 and can be prepared in a form in which a region corresponding to an area of the piezoelectric member 140 or the upper electrode 160 is open. Accordingly, a predetermined air layer can be present at the upper portion of the upper electrode 160. The counter substrate 190 can be adjusted to have the same thickness as that of the substrate 110, but the thickness of the counter substrate 190 is not limited to the same thickness as that of the substrate 110.

Figure 8A:
FIGS. 8A and 8B are results of measuring a surface roughness and a thickness of an upper electrode according to an embodiment of the present disclosure.
Figure 8B:
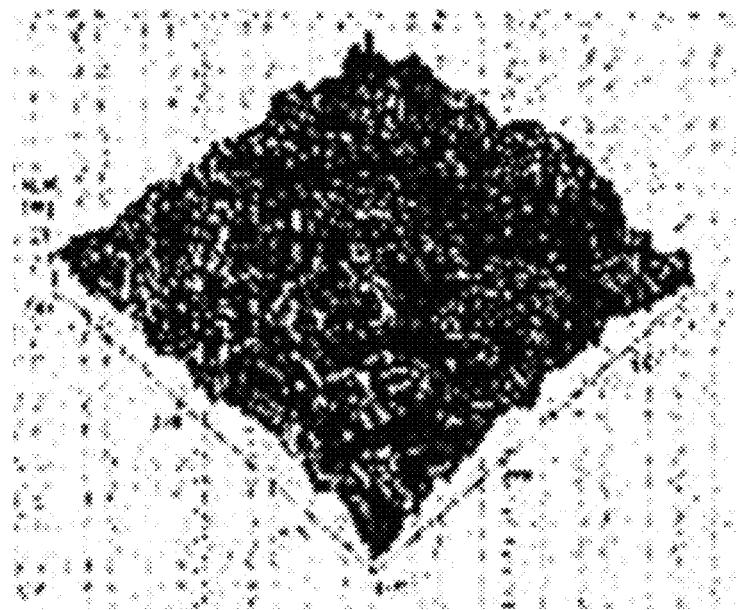

FIGS. 8A and 8B are results of measuring a surface roughness and a thickness of the upper electrodes according to an embodiment of the present disclosure. In FIGS. 8A and 8B, the upper electrodes 16 and 160 were prepared by applying silver paste (Ag paste) to a PVDF film prepared to have a thickness of 24 μm using ethanol as a solvent and drying, and the surface roughness and the thickness were measured using an atomic force microscope (AFM).

With reference to FIGS. 8A and 8B, the thickness of the upper electrodes 16 and 160 was measured to have a uniform thickness of about 13 μm as a whole, and the surface roughness was measured to be about 0.0099 μm. With reference to FIGS. 8A and 8B, it can be seen that the upper electrodes 16 and 160 according to an embodiment of the present disclosure can be uniformly prepared to have fewer surface defects and a low surface roughness value.

Figure 9A:
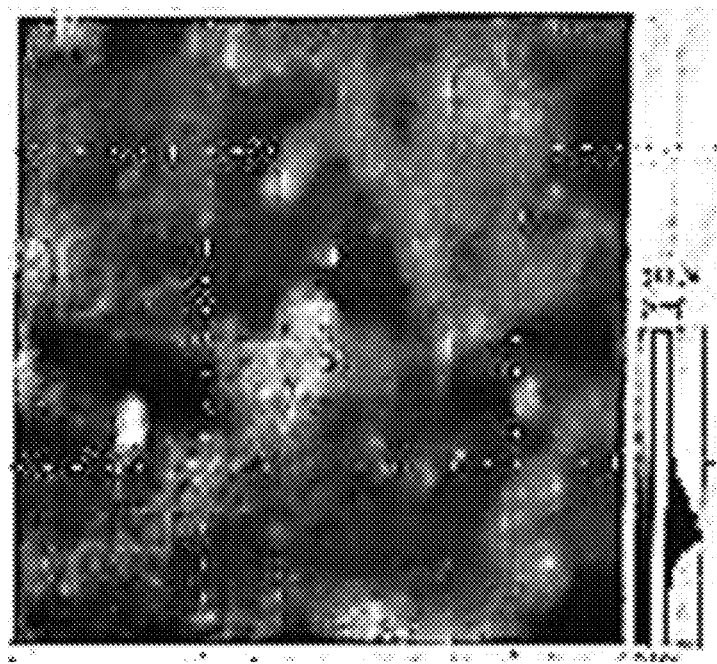
FIGS. 9A and 9B are results of measuring a surface roughness and thickness of an upper electrode according to an experimental example.
Figure 9B:
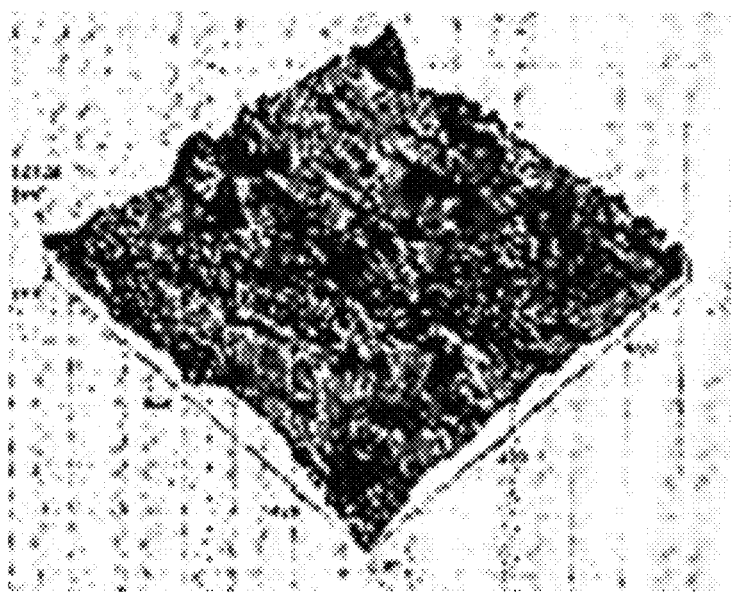

FIGS. 9A and 9B are results of measuring a surface roughness and a thickness of an upper electrode according to experimental example. In FIGS. 9A and 9B, the upper electrode was prepared by attaching a copper tape on a PVDF film prepared to have a thickness of 24 μm using a conductive adhesive member, and surface roughness and thickness were measured using an atomic force microscope (AFM).

With reference to FIGS. 9A and 9B, the upper electrode prepared using the copper tape and the conductive adhesive member was measured to have a thickness of about 38 μm, and surface roughness was measured to be about 0.01 μm.

Figure 10A:
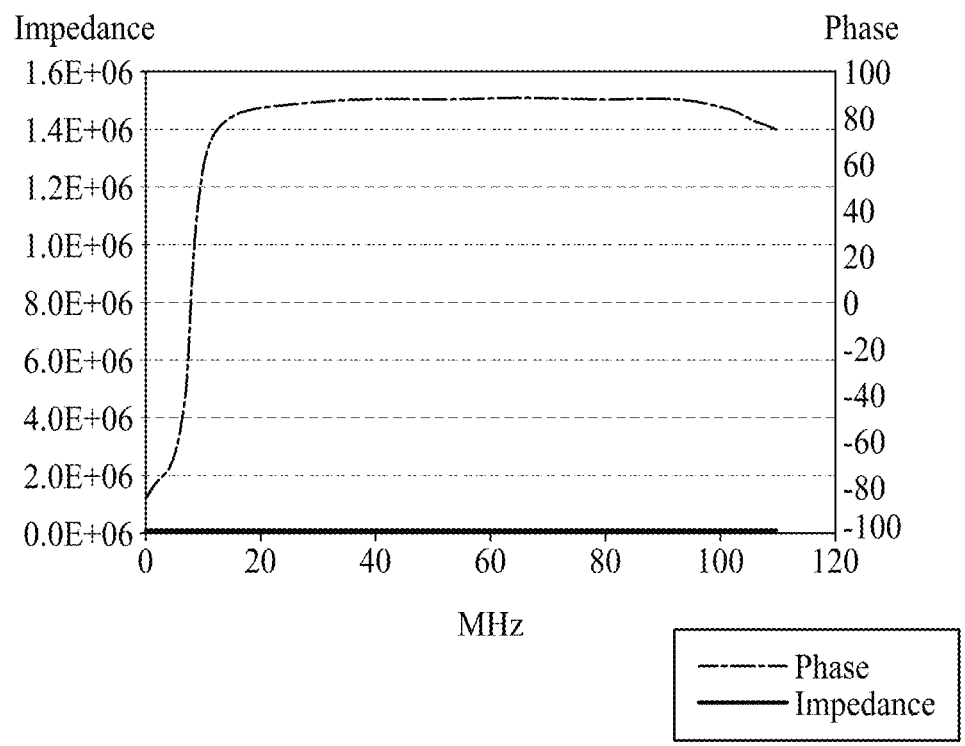
FIG. 10A shows results of measuring a phase and an impedance measurement result according to a frequency of an ultrasonic sensor according to an embodiment of the present disclosure.
Figure 10B:
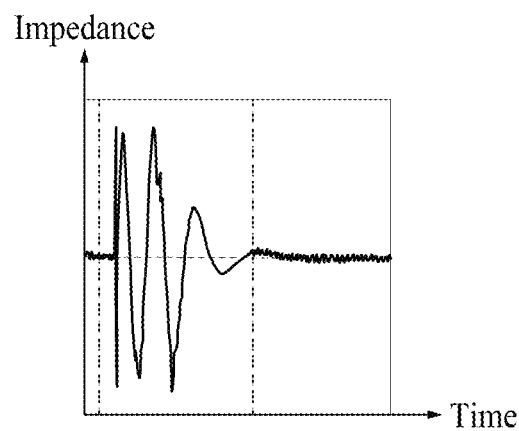
FIGS. 10B and 10C show results of measuring an impedance according to a presence or an absence of a reflector at an upper portion of an ultrasonic sensor according to an embodiment of the present disclosure.
Figure 10C:
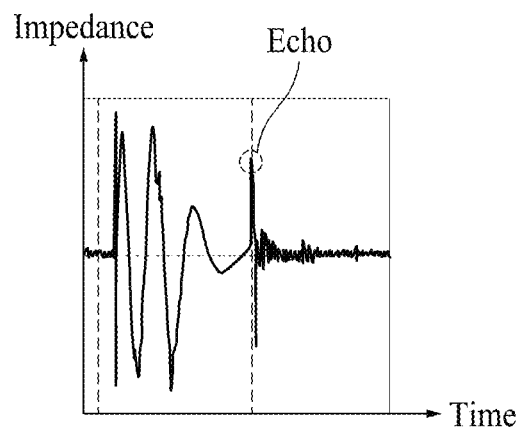

FIG. 10A shows results of measuring a phase and an impedance according to a frequency of an ultrasonic sensor according to an embodiment of the present disclosure. FIGS. 10B and 10C show results of measuring an impedance according to a presence or an absence of a reflector above the ultrasonic sensor according to an embodiment of the present disclosure. The measurement of FIGS. 10A to 10C was performed using a commercial equipment UTEX 340 pulser-receiver, a signal having a length of 2 ns (nanosecond) was generated with an output voltage of 200 Vpp (V peak to peak) and applied to the ultrasonic sensor 1, and a signal received after being echoed by the reflector was amplified by 40 dB in the pulser-receiver to obtain a pulse-echo response and frequency spectrum.

With reference to FIG. 10A, it can be seen that the ultrasonic sensor according to an embodiment of the present disclosure has a high center frequency and a wide bandwidth of about 60 to 70 MHz.

With reference to FIGS. 10B and 10C, in the ultrasonic sensor according to an embodiment of the present disclosure, it can be seen that an ultrasonic wave echoed by a reflector is observed. A received signal of the received ultrasonic wave was measured with an intensity exceeding 6 dB.

Figure 11A:
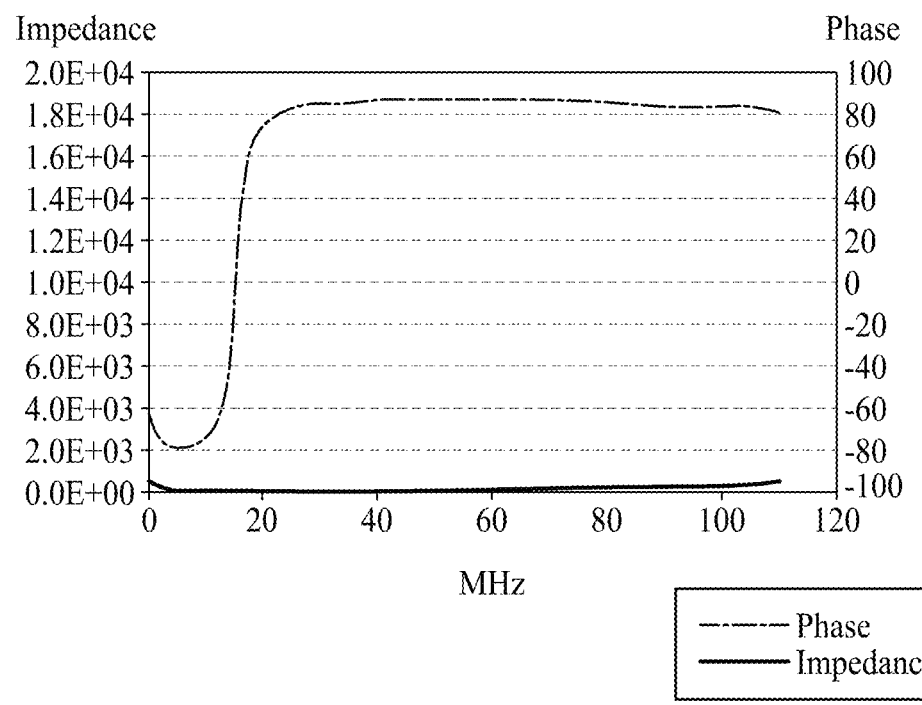
FIG. 11A shows results of measuring a phase and impedance according to a frequency of an ultrasonic sensor according to another embodiment of the present disclosure.

FIG. 11A shows results of measuring a phase and impedance according to frequency of an ultrasonic sensor according to another embodiment of the present disclosure. FIGS.

11B and 11C show results of measuring impedance according to the presence or absence of a reflector above an ultrasonic sensor according to an embodiment of the present disclosure. The measurement of FIGS. 11A to 11C was performed using a commercial equipment UTEX 340 pulser-receiver, a 2 ns (nanosecond)-long signal was generated with a pulse voltage of 200 Vpp (V peak to peak) and applied to the ultrasonic sensor 1, and a signal received after being echoed by a reflector was amplified by 40 dB at the pulser-receiver.

With reference to FIG. 11A, it can be seen that the ultrasonic sensor according to an embodiment of the present disclosure has a high center frequency and a wide bandwidth of about 60 to 70 MHz.

Figure 11B:
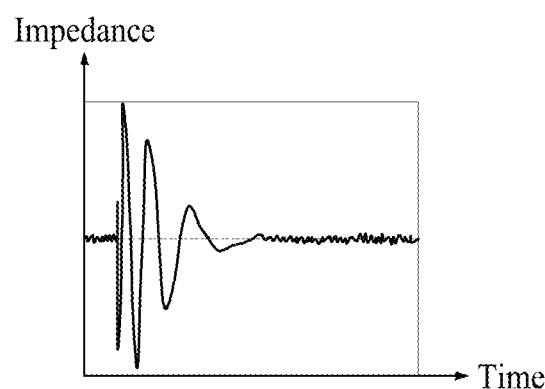
FIGS. 11B and 11C show results of measuring impedance according to the presence or absence of a reflector at an upper portion of the ultrasonic sensor according to another embodiment of the present disclosure.
Figure 11C:
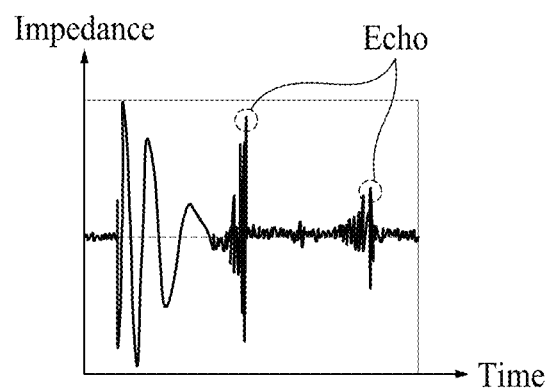

With reference to FIGS. 11B and 11C, it can be seen that, in the ultrasonic sensor according to an embodiment of the present disclosure, an ultrasonic wave echoed by a reflector is observed. A received signal of the received ultrasonic wave was measured with an intensity exceeding 6 dB.

FIGS. 12 to 26 are cross-sectional views of an ultrasonic sensor according to an experimental example.

Figure 12:
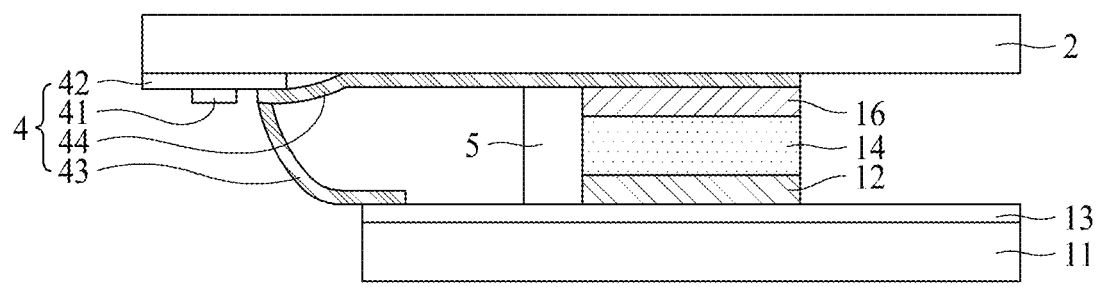
FIGS. 12 to 26 are cross-sectional views of an ultrasonic sensor according to various examples.

The ultrasonic sensor of FIG. 12 was prepared by forming a PVDF film having a width and length of 1 cm and a thickness of 28 μm as a piezoelectric member 14 on an indium tin oxide (ITO) glass substrate 11 having a width and length of 50 mm and a thickness of 1 mm, forming an upper electrode 16 and a lower electrode 12 respectively on the upper and lower portions of the piezoelectric member, and forming an auxiliary member 5 including an insulating epoxy adhesive configured to support a structure on one side of the piezoelectric member 14, the lower electrode 12, and the upper electrode 16. The lower electrode 12 and the upper electrode 16 having silver paste and were prepared to have a thickness of about 10 μm. In addition, in the ultrasonic sensor of FIG. 12, the first wire 43 of the ultrasonic sensor controller 4 and the lower electrode 12 were electrically connected by the medium of the conductive adhesive member 13 prepared as a silicone-based adhesive applied to a front surface of the substrate. The conductive adhesive member 13 was prepared to have a thickness of about 5 μm. In addition, the second wire 44 was provided to cover the entire upper electrode 16. Here, the first wire 43 and the second wire 44 were prepared as a copper tape.

The ultrasonic sensor of FIG. 12 generated a signal of 1 wavelength set at a frequency of 5 MHz, 340 m/s sound speed, and 300V voltage using a commercial equipment UTEX 340 pulser-receiver and applied the signal to the ultrasonic sensor 1, and a signal received after being echoed from a reflector was amplified by 20 dB in the pulser-receiver to obtain a pulse-echo response and frequency spectrum.

Figure 27:
FIG. 27 shows a pulser-receiver measurement waveform of FIGS. 12 to 26.

As illustrated in FIG. 27, in the ultrasonic sensor prepared as in FIG. 12, only the ultrasonic wave transmission waveform was measured, and a received signal reflected by the reflector was not observed. In addition, a ultrasonic transmission intensity of the ultrasonic sensor prepared by FIG. 12 was measured to have a slightly lower intensity.

Figure 13:
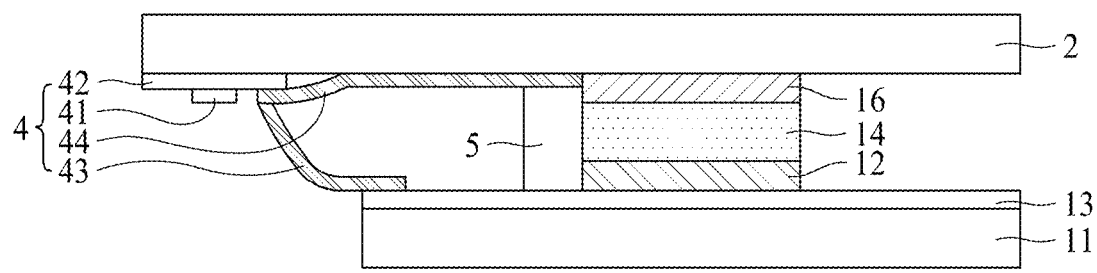

Compared to the ultrasonic sensor of FIG. 12, the ultrasonic sensor of FIG. 13 has the same configuration except that the second wire 44 is not disposed to cover the upper electrode 16 and is configured to contact only one side of the upper electrode 16. Therefore, a repeated description is may be omitted or may be briefly provided.

The ultrasonic sensor of FIG. 13 generated a signal of 1 wavelength set at a frequency of 5 MHz, 340 m/s sound speed, and 300V voltage using a commercial equipment UTEX 340 pulser-receiver and applied the signal to the ultrasonic sensor 1, and a signal received after being echoed from a reflector was amplified by 20 dB in the pulser-receiver to obtain a pulse-echo response and frequency spectrum.

As illustrated in FIG. 27, in the ultrasonic sensor prepared as in FIG. 13, only the ultrasonic wave transmission waveform was measured, and a received signal reflected by the reflector was not observed. In addition, an ultrasonic transmission intensity of the ultrasonic sensor prepared by FIG. 13 was measured to be lower, compared to the ultrasonic sensor prepared by FIG. 12.

Figure 14:
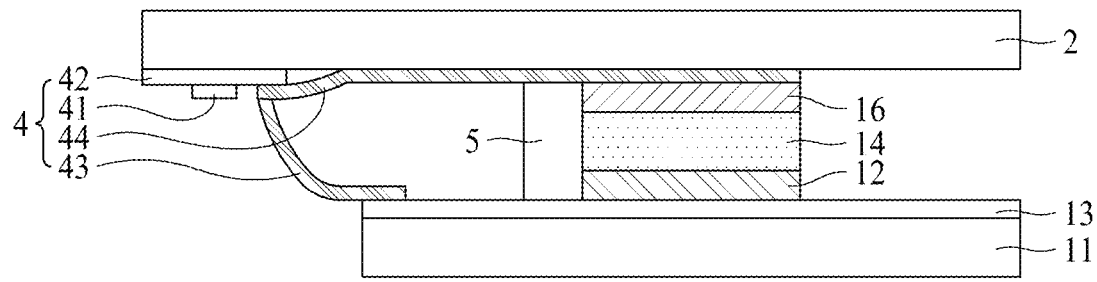

The ultrasonic sensor of FIG. 14 has the same structure as that of the ultrasonic sensor of FIG. 12, except that the conductive adhesive member 13 was changed to a conductive epoxy adhesive. Therefore, a repeated description may be omitted or may be briefly provided.

The ultrasonic sensor of FIG. 14 generated a signal of 1 wavelength set at a frequency of 5 MHz, 340 m/s sound speed, and 300V voltage using a commercial equipment UTEX 340 pulser-receiver and applied the signal to the ultrasonic sensor 1, and a signal received after being echoed from a reflector was amplified by 20 dB in the pulser-receiver to obtain a pulse-echo response and frequency spectrum.

As illustrated in FIG. 27, in the ultrasonic sensor prepared as in FIG. 14, only the ultrasonic wave transmission waveform was measured, and a received signal reflected by the reflector was not observed. In addition, an ultrasonic transmission intensity of the ultrasonic sensor prepared by FIG. 14 was measured to be similar, compared to the ultrasonic sensor prepared by FIG. 12.

Figure 15:
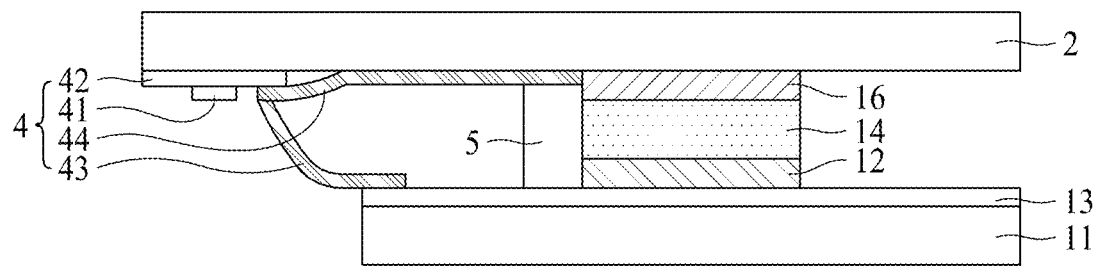

The ultrasonic sensor of FIG. 15 has the same structure as that of the ultrasonic sensor of FIG. 13, except that the conductive adhesive member 13 was changed to a conductive epoxy adhesive. Therefore, a repeated description may be omitted or may be briefly provided.

The ultrasonic sensor of FIG. 15 generated a signal of 1 wavelength set at a frequency of 5 MHz, 340 m/s sound speed, and 300V voltage using a commercial equipment UTEX 340 pulser-receiver and applied the signal to the ultrasonic sensor 1, and a signal received after being echoed from a reflector was amplified by 20 dB in the pulser-receiver to obtain a pulse-echo response and frequency spectrum.

As illustrated in FIG. 27, in the ultrasonic sensor prepared as in FIG. 15, only the ultrasonic wave transmission waveform was measured, and a received signal reflected by the reflector was not observed. In addition, an ultrasonic transmission intensity of the ultrasonic sensor prepared by FIG. 15 was measured to be lower, compared to the ultrasonic sensor prepared by FIG. 12.

Figure 16:
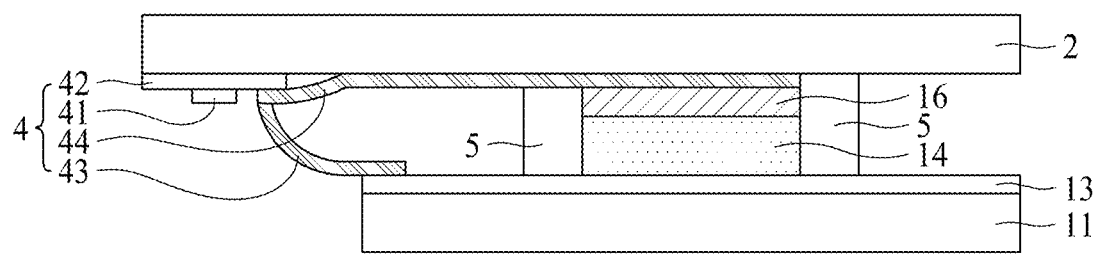

The ultrasonic sensor of FIG. 16 was prepared by forming a PVDF film having a width and length of 1 cm and a thickness of 28 μm as a piezoelectric member 14 on an indium tin oxide (ITO) glass substrate 11 having a width and length of 50 mm and a thickness of 1 mm, forming the upper electrode 16 including a silver paste at an upper portion of the piezoelectric member, and forming an auxiliary member 5 including an insulating epoxy adhesive to surround a side surface of the upper electrode 16 and the piezoelectric member 14. The upper electrode 16 was prepared to have a thickness of about 10 μm. In the ultrasonic sensor of FIG. 16, the first wire 43 and the piezoelectric member 14 were electrically connected by the medium of the conductive adhesive member 13 prepared as a conductive epoxy adhesive applied to a front surface of the substrate. The conductive adhesive member 13 was prepared to have a thickness of about 5 μm. In addition, the second wire 44 was provided to cover the entire upper electrode 16. Here, the first wire 43 and the second wire 44 were prepared as a copper tape.

The ultrasonic sensor of FIG. 16 generated a signal of 1 wavelength set at a frequency of 5 MHz, 340 m/s sound speed, and 300V voltage using a commercial equipment UTEX 340 pulser-receiver and applied the signal to the ultrasonic sensor 1, and a signal received after being echoed from a reflector was amplified by 20 dB in the pulser-receiver to obtain a pulse-echo response and frequency spectrum.

As illustrated in FIG. 27, in the ultrasonic sensor prepared as in FIG. 16, only the ultrasonic wave transmission waveform was measured, and a received signal reflected by the reflector was not observed. In addition, a ultrasonic transmission intensity of the ultrasonic sensor prepared by FIG. 16 was measured to be lower, compared with the ultrasonic sensor prepared by FIG. 12.

Figure 17:
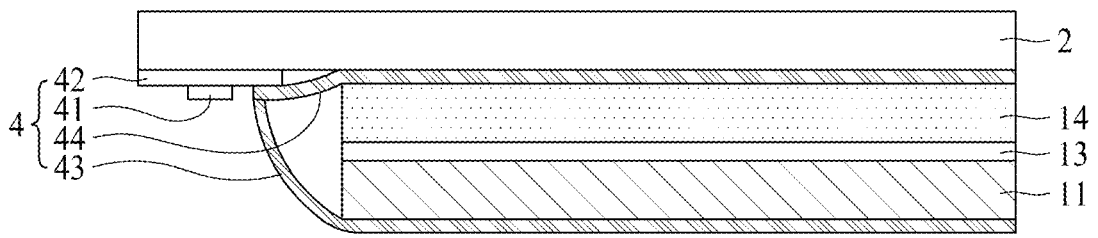

In the ultrasonic sensor of FIG. 17, a PVDF film having a width and length of 50 mm and a thickness of 28 μm was formed as a piezoelectric member 14 on a brass substrate 11 having a width and length of 50 mm and a thickness of 1 mm, and an electrode on and under the piezoelectric member was omitted. A conductive adhesive member 13 formed of a silicone-based adhesive having a thickness of 5 μm was formed between the substrate 11 and the piezoelectric member 14. The second wire 44 of the ultrasonic sensor controller 4 was prepared to contact a portion of the piezoelectric member 14, and the first wire 43 was prepared to contact at least a portion of the substrate 11.

The ultrasonic sensor of FIG. 17 generated a signal of 1 wavelength set at a frequency of 5 MHz, 340 m/s sound speed, and 300V voltage using a commercial equipment UTEX 340 pulser-receiver and applied the signal to the ultrasonic sensor 1, and a signal received after being echoed from a reflector was amplified by 20 dB in the pulser-receiver to obtain a pulse-echo response and frequency spectrum.

As illustrated in FIG. 27, in the ultrasonic sensor prepared as in FIG. 17, only the ultrasonic wave transmission waveform was measured, and a received signal reflected by the reflector was not observed. An ultrasonic transmission intensity of the ultrasonic sensor prepared by FIG. 17 was measured to be higher, compared with the ultrasonic sensor prepared by FIG. 12.

Figure 18:
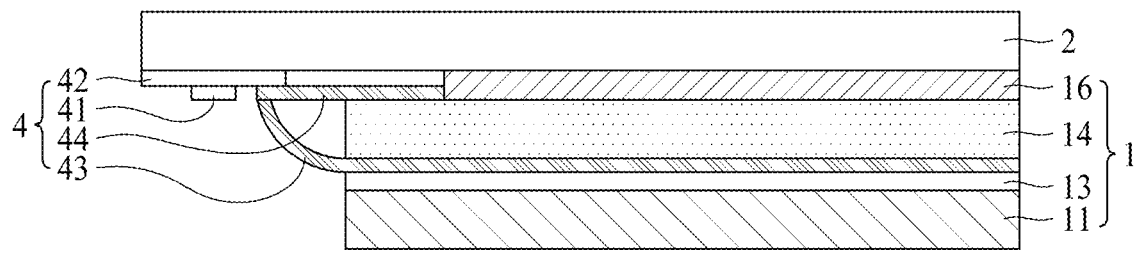

Compared with the ultrasonic sensor of FIG. 17, the ultrasonic sensor of FIG. 18 was prepared to have the same structure as that of FIG. 17, except that a position of the first wire was changed to contact a lower surface of the piezoelectric member 14, the upper electrode 16 is formed on the piezoelectric member, and the upper electrode 16 was configured to contact the second wire. Therefore, the repeated description may be omitted or may be briefly provided. The upper electrode of FIG. 18 included silver paste and was prepared to have a thickness of about 10 μm.

The ultrasonic sensor of FIG. 18 generated a signal of 1 wavelength set at a frequency of 5 MHz, 340 m/s sound speed, and 300V voltage using a commercial equipment UTEX 340 pulser-receiver and applied the signal to the ultrasonic sensor 1, and a signal received after being echoed from a reflector was amplified by 20 dB in the pulser-receiver to obtain a pulse-echo response and frequency spectrum.

As illustrated in FIG. 27, in the ultrasonic sensor prepared as in FIG. 18, only the ultrasonic wave transmission waveform was measured, and a received signal reflected by the reflector was not observed. An ultrasonic transmission intensity of the ultrasonic sensor prepared by FIG. 18 was measured to have high intensity, compared with the ultrasonic sensor prepared by FIG. 12.

Figure 19:
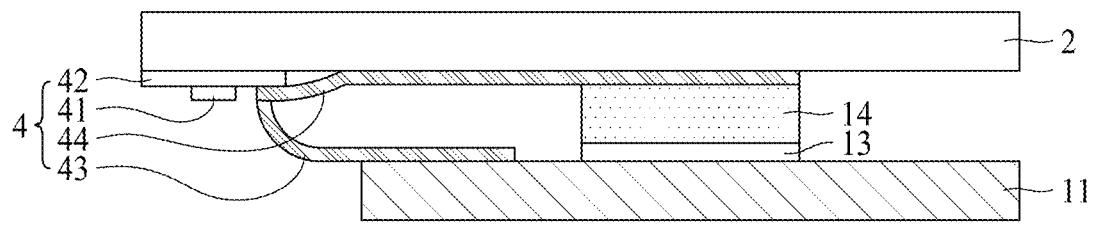

In the ultrasonic sensor of FIG. 19, with a PVDF film having a width and length of 50 mm and a thickness of 28 μm was formed as a piezoelectric member 14 on a brass substrate 11 having a width and length of 1 cm and a thickness of 1 mm, and an electrode on and under the piezoelectric member was omitted. A conductive adhesive member 13 including acrylic UV adhesive having a thickness of 5 μm was formed between the substrate 11 and the piezoelectric member 14. The second wire 44 of the ultrasonic sensor controller 4 was prepared to cover an upper surface of the piezoelectric member 14, and the first wire 43 was prepared to contact at least a portion of the substrate 11.

Figure 28:
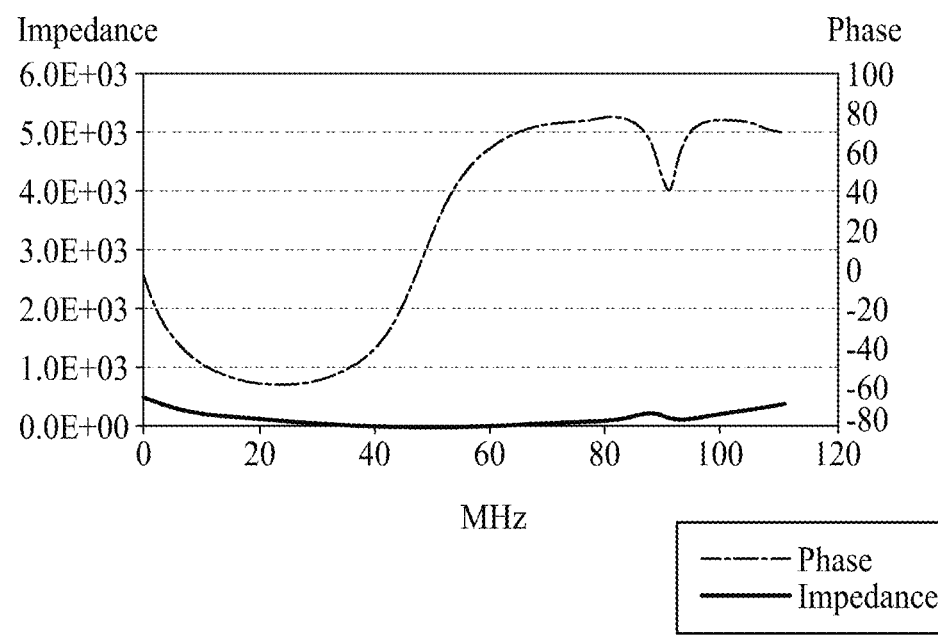
FIG. 28 shows results of measuring a phase and an impedance according to a frequency of an ultrasonic sensor of the experimental example of FIG. 19.
Figure 29:
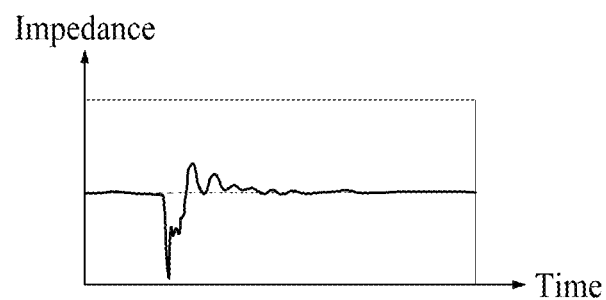
FIG. 29 shows a pulser-receiver transmission waveform of the experimental example of FIG. 19.

As the ultrasonic sensor of FIG. 19, a commercial equipment UTEX 340 pulser-receiver, a signal having a length of 2 ns (nanosecond) was generated with an output voltage of 200 Vpp and applied to the ultrasonic sensor 1, and a signal received after being echoed by the reflector was amplified by 40 dB in the pulser-receiver to obtain a pulse-echo response and frequency spectrum, and results thereof are illustrated in FIGS. 28 and 29.

It can be seen that the ultrasonic sensor prepared as in FIG. 19 has a high center frequency and a wide bandwidth of about 60 to 70 MHz, as illustrated in FIG. 28.

In addition, in the ultrasonic sensor prepared as in FIG. 19, pulser-receiver measurement waveforms were observed under various conditions, such as oscillation in the air, oscillation in the air after applying a gel, and oscillation in the air after adding a reflector and applying a gel as illustrated in FIG. 29, but a received signal echoed by the reflector was not observed. In addition, an ultrasonic transmission intensity of the ultrasonic sensor prepared by FIG. 19 was measured to be lower, compared to the ultrasonic sensor prepared by FIG. 12.

Figure 20:
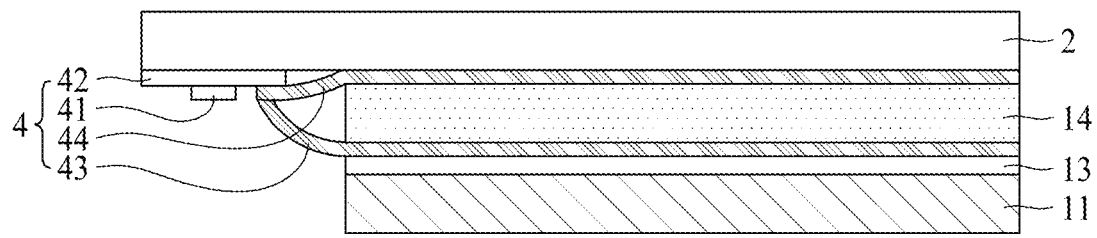

Compared with the ultrasonic sensor of FIG. 17, the ultrasonic sensor of FIG. 20 was prepared to have the same structure as that of FIG. 17, except that a position of the first wire was changed to contact a lower surface of the piezoelectric member 14 and the conductive adhesive member 13 was changed to an insulating epoxy adhesive. Therefore, a repeated description may be omitted or may be briefly provided.

The ultrasonic sensor of FIG. 20 generated a signal of 1 wavelength set at a frequency of 5 MHz, 340 m/s sound speed, and 300V voltage using a commercial equipment UTEX 340 pulser-receiver and applied the signal to the ultrasonic sensor 1, and a signal received after being echoed from a reflector was amplified by 20 dB in the pulser-receiver to obtain a pulse-echo response and frequency spectrum.

As illustrated in FIG. 27, in the ultrasonic sensor prepared as in FIG. 20, only the ultrasonic wave transmission waveform was measured, and a received signal reflected by the reflector was not observed. An ultrasonic transmission intensity of the ultrasonic sensor prepared by FIG. 20 was measured to be higher, compared with the ultrasonic sensor prepared by FIG. 12.

Figure 21:
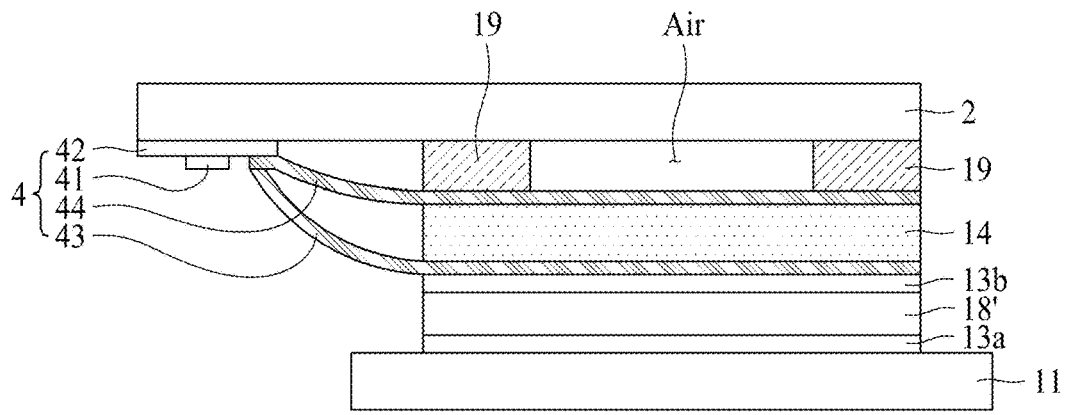

In the ultrasonic sensor of FIG. 21, a PVDF film having a width and length of 20 mm and a thickness of 20 μm was formed as a piezoelectric member 14 on a polyimide substrate 11 having a width and length of 25 mm and a thickness of 50 μm, an electrode on and under the piezoelectric member 14 was omitted, and the first wire 43 and the second wire 44 each are configured to contact at least a portion of a lower surface and an upper surface of the piezoelectric member 14. Thereafter, paper having a width and length of 20 mm and a thickness of 2 mm was added as a supporting member 18' between the piezoelectric member, the first wire, and the substrate 11, and conductive adhesive members 13a and 13b were formed to a thickness of 10 µm as a silicone-based adhesive on both sides of the supporting member 18'. In addition, a counter substrate 19 was prepared on the piezoelectric member 14 and the second wire 43, and the counter substrate 19 has the same dimensions as the substrate 11 but has an opening having a size corresponding to the piezoelectric member 14. Here, the piezoelectric member 14 and the supporting member 18' can be arranged in the center of the substrate 11.

Figure 22:
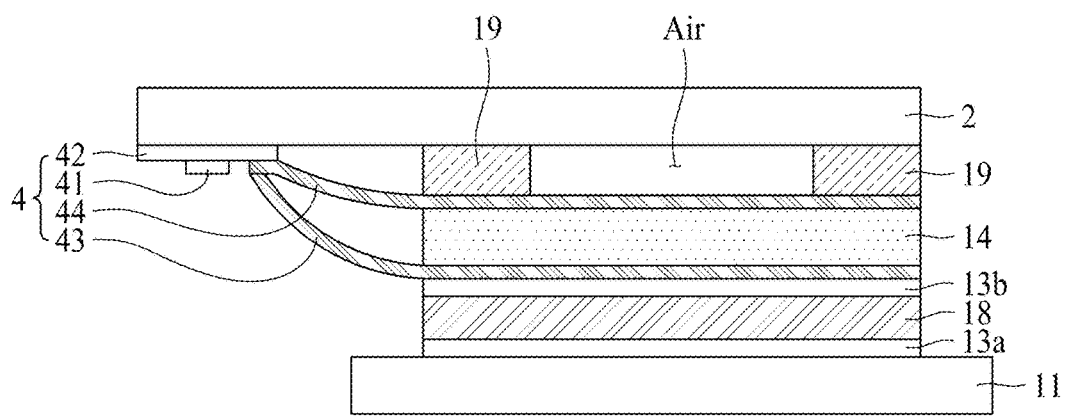

The ultrasonic sensor of FIG. 22 was prepared to have the same configuration as the ultrasonic sensor of FIG. 21, except that the supporting member 18 was changed to an aluminum plate. Therefore, a repeated description may be omitted or may be briefly provided.

Figure 23:
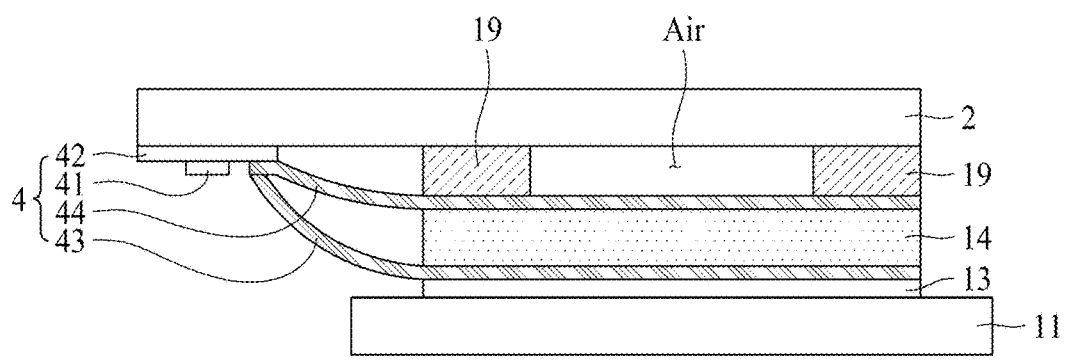

The ultrasonic sensor of FIG. 23 was prepared to have the same configuration as the ultrasonic sensor of FIG. 21, except that the configuration of the supporting member 18' and the conductive adhesive member 13b was excluded. Therefore, a repeated description may be omitted or may be briefly provided.

Figure 24:
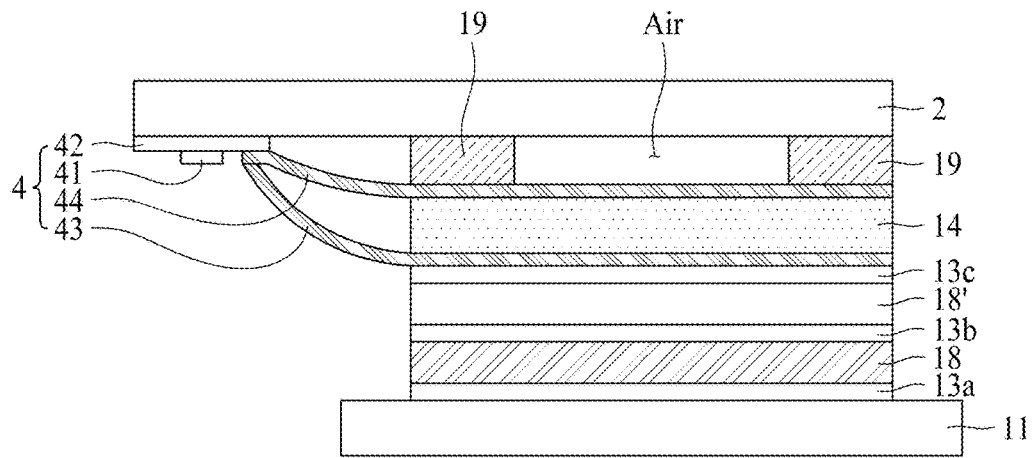

The ultrasonic sensor of FIG. 24 was prepared to have the same configuration as the ultrasonic sensor of FIG. 21, except that a first conductive adhesive member 13a, a supporting member 18 formed of an aluminum plate, a second conductive adhesive member 13b, a supporting member 18' formed of paper, and a third conductive adhesive member 13c are sequentially configured between the substrate 11 and the first wire 43, while the structure on the first wire may be substantially the same. Therefore, a repeated description may be omitted or may be briefly provided.

The ultrasonic sensor of FIGS. 21 to 24 generated a signal of 1 wavelength set at a frequency of 5 MHz, 340 m/s sound speed, and 300V voltage using a commercial equipment UTEX 340 pulser-receiver and applied the signal to the ultrasonic sensor 1, and a signal received after being echoed from a reflector was amplified by 20 dB in the pulser-receiver to obtain a pulse-echo response and frequency spectrum.

As illustrated in FIG. 27, in the ultrasonic sensor prepared as in FIGS. 21 to 24, only the ultrasonic wave transmission waveform was measured, and a received signal reflected by the reflector was not observed. In addition, an ultrasonic transmission intensity of the ultrasonic sensor prepared by FIGS. 21 to 24 was measured to have lower intensity, compared to the ultrasonic sensor prepared by FIG. 12.

Figure 25:
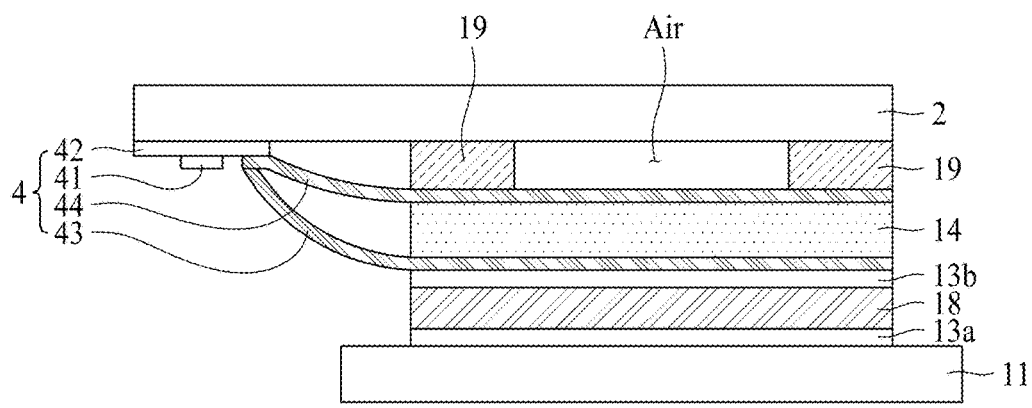

The ultrasonic sensor of FIG. 25 was prepared to have the same configuration as the ultrasonic sensor of FIG. 22, except that the supporting member 18 was changed to brass. Therefore, a repeated description may be omitted or may be briefly provided.

Figure 30:
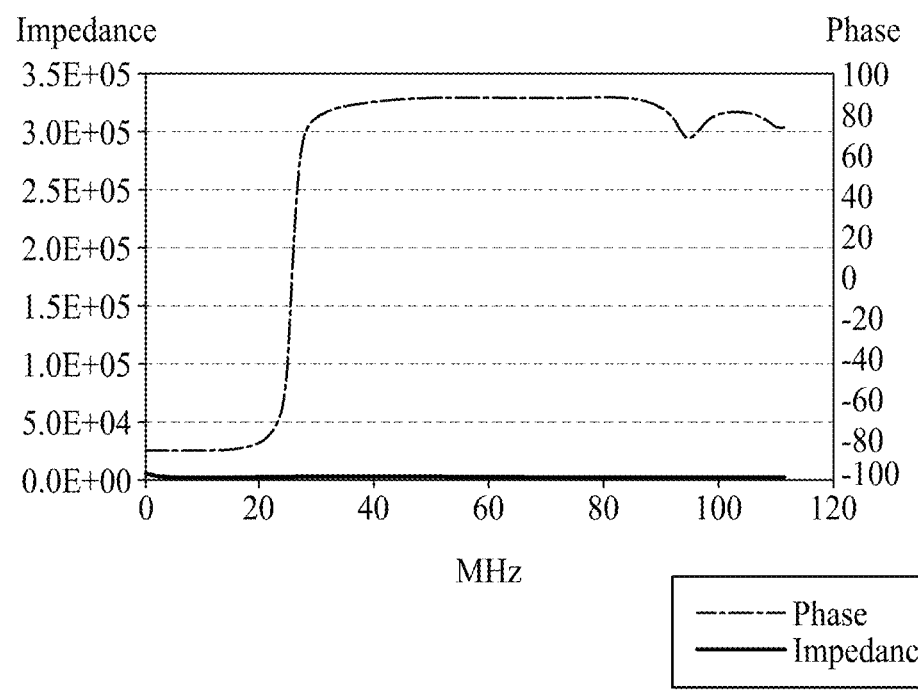
FIG. 30 shows results of measuring a phase and an impedance according to a frequency of an ultrasonic sensor of the experimental example of FIG. 25.

As the ultrasonic sensor of FIG. 25, with a commercial equipment UTEX 340 pulser-receiver, a signal having a length of 2 ns (nanosecond) was generated with an output voltage of 200 Vpp and applied to the ultrasonic sensor 1, and a signal received after being echoed by the reflector was amplified by 40 dB in the pulser-receiver to obtain a pulse-echo response and frequency spectrum, and results thereof are illustrated in FIGS. 29 and 30.

It can be seen that the ultrasonic sensor prepared as in FIG. 25 has a high center frequency and a wide bandwidth of about 60 to 70 MHz, as illustrated in FIG. 30.

In addition, in the ultrasonic sensor prepared as in FIG. 25, pulser-receiver measurement waveforms were observed under various conditions, such as oscillation in the air, oscillation in the air after applying a gel, and oscillation in the air after adding a reflector and applying a gel as illustrated in FIG. 29, but a received signal echoed by the reflector was not observed. In addition, an ultrasonic transmission intensity of the ultrasonic sensor prepared by FIG. 25 was measured to be lower, compared to the ultrasonic sensor prepared by FIG. 12.

Figure 26:
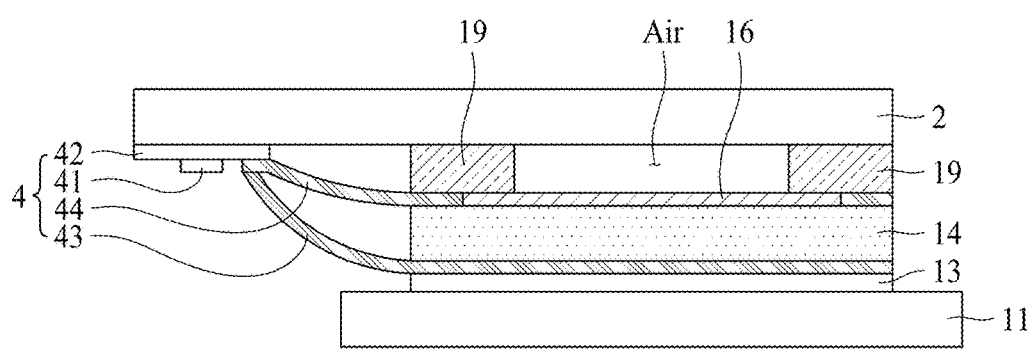

The ultrasonic sensor of FIG. 26 was prepared to have the same configuration as the ultrasonic sensor of FIG. 23, except that the upper electrode 16 was additionally configured on the piezoelectric member 14. Therefore, a repeated description may be omitted or may be briefly provided.

Figure 31:
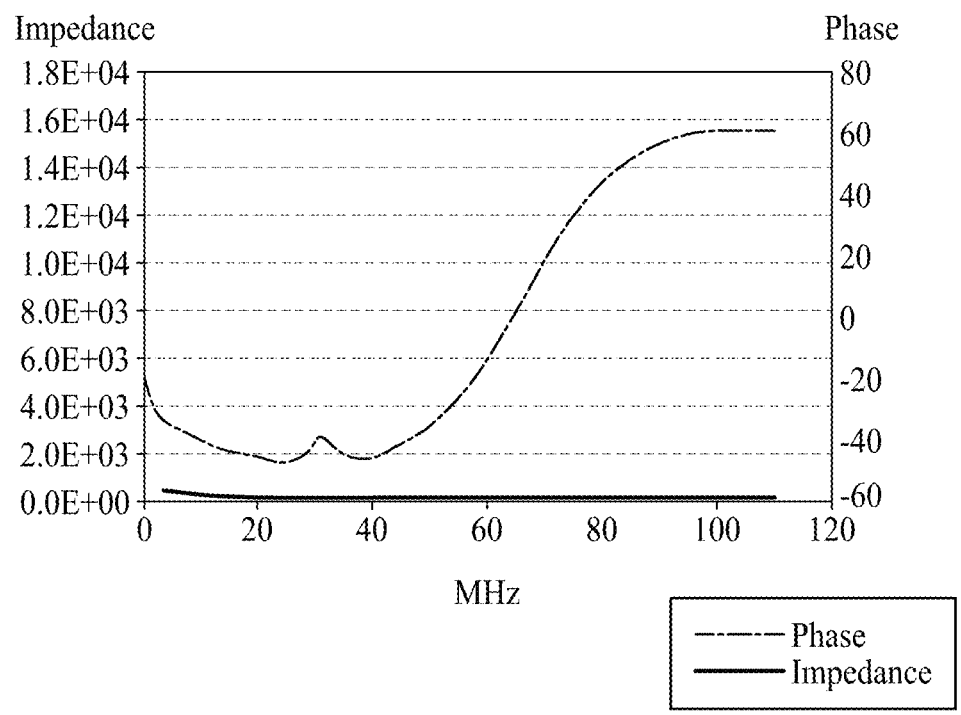

As the ultrasonic sensor of FIG. 26, with a commercial equipment UTEX 340 pulser-receiver, a signal having a length of 2 ns (nanosecond) was generated with an output voltage of 200 Vpp and applied to the ultrasonic sensor 1, and a signal received after being echoed by the reflector was amplified by 40 dB in the pulser-receiver to obtain a pulse-echo response and frequency spectrum, and results thereof are illustrated in FIG. 31. It can be seen that the ultrasonic sensor prepared as in FIG. 26 has a high center frequency and a wide bandwidth of about 60 to 70 MHz, as illustrated in FIG. 31.

As illustrated in FIG. 27, in the ultrasonic sensor prepared as in FIG. 26, only the ultrasonic wave transmission waveform was measured, and a received signal reflected by the reflector was not observed. An ultrasonic transmission intensity of the ultrasonic sensor prepared by FIG. 26 was measured to have lower intensity, compared with the ultrasonic sensor prepared by FIG. 12.

FIGS. 32A to 32E show a method of manufacturing an ultrasonic sensor according to another embodiment of the present disclosure.

Figure 32A:
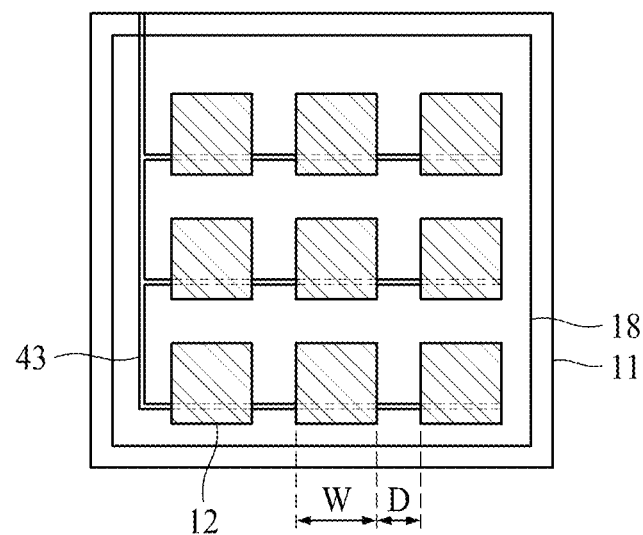
FIGS. 32A to 32E illustrate a process of a method of manufacturing an ultrasonic sensor according to another embodiment of the present disclosure.

First, with reference to FIG. 32A, the lower electrode 12 is patterned on the substrate 11, and the first wire 43 of the ultrasonic sensor controller is connected to at least one side of the lower electrode 12. In addition, the supporting member 18 can be disposed between the substrate 11 and the lower electrode 12, and at least a portion of the first wire 43 can be disposed to overlap the lower electrode 12.

Here, the substrate 11 can be a plastic substrate. When a plastic substrate is used as the substrate 11, the substrate can be prepared as a polyimide substrate having a thickness of about 0.2 mm.

The supporting member 18 can be an aluminum plate having a thickness of about 0.2 mm, and the piezoelectric member 14 can be disposed to have a size corresponding to the substrate 11 or disposed to correspond only to each of the plurality of piezoelectric members 14.

The lower electrode 12 can be disposed on the substrate 11, and can also be disposed on the supporting member 18.

When the lower electrode 12 includes silver (Ag), a silver (Ag) paste including silver (Ag) nanoparticles, a solvent, a binder, etc. can be prepared through a screen printing process or a spray process and can be prepared as an ethanol-based solvent in order not to use a harmful organic solvent such as a ketone-based solvent.

Therefore, when the lower electrode 12 includes a silver (Ag) paste, the lower electrode 12 can be configured finally as a composite structure including a silver (Ag) paste and a binder after undergoing a coating and drying process based on the solution described above.

Figure 32B:
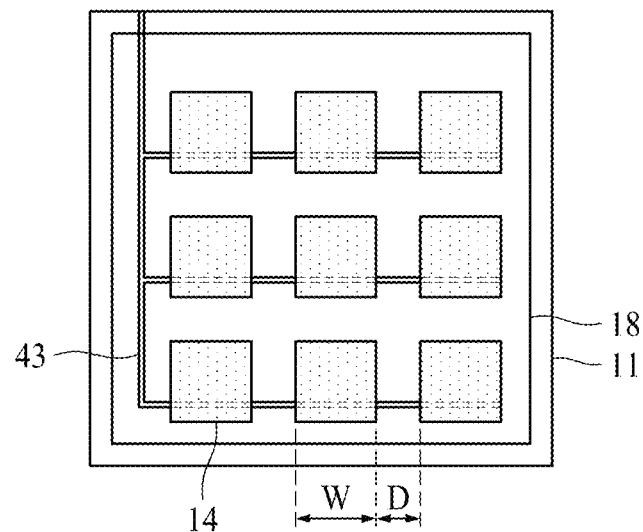

The lower electrode 12 can be configured through a screen printing process or a spraying process based on a solvent-free without a binder. As illustrated in FIG. 32A, it can be patterned to predetermined to a preset area. Here, the preset region can be a region in which the piezoelectric member 14 described with reference to FIG. 32B is disposed, for example, the predetermined region can be a unit pixel region of the ultrasonic sensor.

The lower electrode 12 can be adjusted to have a predetermined horizontal and vertical width W, and can be formed in a rectangular or square shape. In FIG. 32A, a square having the same horizontal and vertical widths is illustrated. For example, the horizontal and vertical width of the lower electrode 12 can be 20 µm, but embodiments of the present disclosure are not limited thereto. In addition, the lower electrode 12 can be formed to be spaced apart from another adjacent lower electrode 12 by a predetermined distance D. For example, the distance D between the lower electrode 12 and another adjacent lower electrode 12 can be 10 µm, but embodiments of the present disclosure are not limited thereto. Here, the described width W of the lower electrode 12 and the distance D between the lower electrode 12 and the other adjacent lower electrode 12 can be equally applied to the width W of each of the piezoelectric member 14 and the upper electrode 16. Numerical values of the dimensions and interval (or distance) of the lower electrode 12, the piezoelectric member 14, and the upper electrode 16 of the ultrasonic sensor according to an embodiment of the present disclosure are not limited to the above description.

Accordingly, the lower electrode 12 can be patterned after being prepared by performing the screen printing process or spraying process described above. Alternatively, the lower electrode 12 can be prepared to be formed only in a predetermined area using a predetermined mask pattern.

The first wire 43 can be in contact with at least one side of the lower electrode 12, or can be disposed to at least partially overlap the lower electrode 12. The first wire 43 can be formed of a copper tape having high electrical conductivity, but embodiments of the present disclosure are not limited thereto.

Next, with reference to FIG. 32B, the piezoelectric member 14 may be disposed on the lower electrode 12 with a size corresponding to the lower electrode 12. Here, the corresponding size can include the same size as the lower electrode 12, a size smaller than the lower electrode 12, and a size larger than the lower electrode 12, and the piezoelectric member 14 can be a size that does not affect driving of the ultrasonic sensor in a unit pixel area of a neighboring ultrasonic sensor.

The piezoelectric member 14 can be a film-type piezoelectric member 14 including ferroelectric polymers such as polyvinylidene fluoride (PVDF) and polyvinylidene fluoride-trifluoroethylene (PVDF-TrFE) copolymers. In the ultrasonic sensor 1 according to an embodiment of the present disclosure, the piezoelectric member 14 may not be limited to the materials described above, and a material capable of converting electrical energy into mechanical energy by a piezoelectric phenomenon and a reverse piezoelectric phenomenon to generate ultrasonic waves having a predetermined frequency and converting mechanical energy into electrical energy can be used without limitations.

According to an embodiment of the present disclosure, the piezoelectric member 14 can be a compressed or stretched (or elongated) film-type piezoelectric member which is subjected to polling in one direction, and according to an embodiment of the present disclosure, the piezoelectric member 14 can have a thickness of 10 to 50 µm.

The piezoelectric member 14 can be adjusted to have a predetermined horizontal and vertical width W, and can be formed in a rectangular or square shape. In addition, the piezoelectric member 14 can be formed to be spaced apart from another adjacent piezoelectric member 14 by a predetermined distance D. Here, the description of the lower electrode 12 can be equally applied to the width W of the piezoelectric member 14 and the predetermined distance D from the other adjacent piezoelectric member 14.

Accordingly, the piezoelectric member 14 can be prepared by patterning a film-shaped piezoelectric member to correspond to a preset area. In addition, if necessary, an adhesive member can be disposed between the piezoelectric member 14 and the lower electrode 12.

Figure 32C:
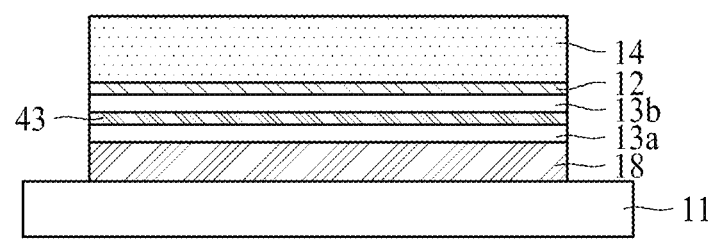

FIG. 32C illustrates an ultrasonic sensor in a state manufactured by FIG. 32B. With reference to FIG. 32C, the supporting member 18, the lower electrode 12, and the piezoelectric member 14 can be sequentially disposed on the substrate 11. When the first wire 43 is disposed under the lower electrode 12, the first conductive adhesive member 13a can be disposed under the first wire 43, and the second conductive adhesive member 13b can be disposed on the first wire 43. Accordingly, the first wire 43 can be electrically connected to the lower electrode 12 through the second conductive adhesive member 13b.

The first and second conductive adhesive members 13a and 13b can include at least one of a silicone-based adhesive, a conductive epoxy adhesive, an insulating epoxy adhesive, and an acrylic-based ultraviolet (UV) adhesive, but embodiments of the present disclosure are limited thereto. According to an embodiment of the present disclosure, the thickness of the first and second conductive adhesive members 13a and 13b can be 5 µm or less. When the thickness of the first and second conductive adhesive members 13a and 13b exceeds 5 µm, ultrasonic transmission/reception efficiency can be lowered.

Figure 32D:
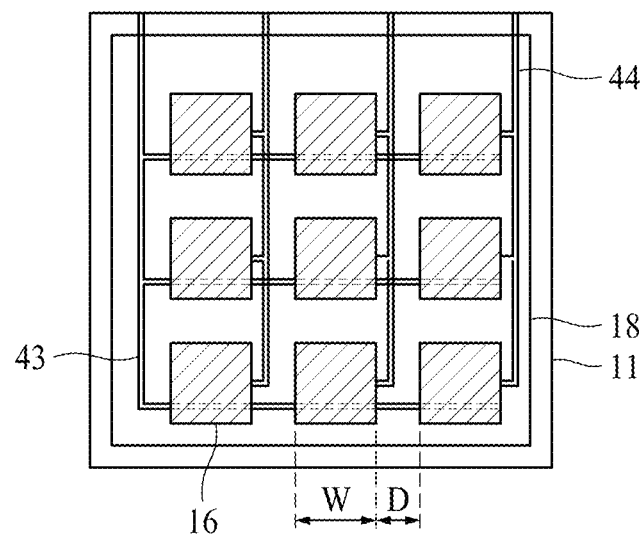

Next, with reference to FIG. 32D, the upper electrode 16 can be formed on the piezoelectric member 14 to have a corresponding size. For example, the upper electrode 16 can be patterned to have a corresponding size on the piezoelectric member 14.

Figure 32E:
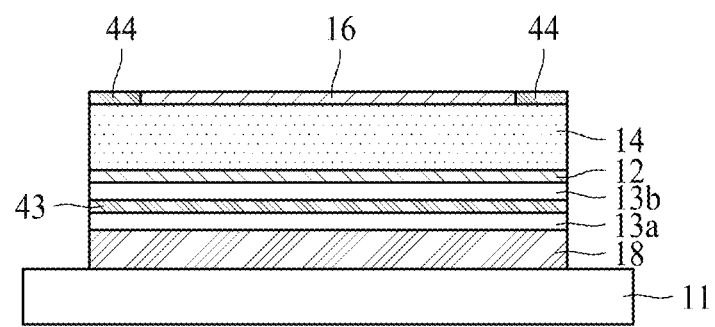

The upper electrode 16 may be disposed on the piezoelectric member 14 in a size corresponding to the piezoelectric member 14. Here, the corresponding size can include a size which is the same as that of the piezoelectric member 14, a size smaller than that of the piezoelectric member 14, and a size greater than that of the piezoelectric member 14, and can be a size that does not affect driving of the ultrasonic sensor of a unit pixel area of a neighboring ultrasonic sensor. With reference to FIG. 32E, it can be seen that the upper electrode 16 has a size slightly smaller than that of the piezoelectric member 14.

The upper electrode 16 can be adjusted to have a predetermined horizontal and vertical width W and can be formed in a rectangular or square shape. Further, the upper electrode 16 can be formed to be spaced apart from another adjacent upper electrode 16 by a predetermined distance D. Here, the description of the upper electrode 16 can be equally applied to the width W of the upper electrode 16 and the predetermined distance D from the other adjacent piezoelectric member 14.

Accordingly, the upper electrode 16 can be prepared by performing the screen printing process or spraying process as described above and then patterned. Alternatively, the upper electrode 16 can be prepared to be formed only in a predetermined region using a predetermined mask pattern.

The upper electrode 16 can be an electrode including silver (Ag). For example, when the upper electrode 16 is used as a solid metal including silver (Ag), ultrasonic waves can be attenuated or the intensity of a center frequency can be lowered due to a damping effect of ultrasonic characteristics of the ultrasonic sensor due to a difference in physical properties with the piezoelectric member 14. Therefore, the upper electrode 16 according to an embodiment of the present disclosure can be silver paste (Ag paste). For example, the silver paste can be silver paint or silver epoxy. Here, the silver paint or silver epoxy can be a material including both silver nanoparticles and a binder.

The silver nanoparticles can have a size of 200 nm or less. When the size of the silver nanoparticles is 200 nm or less, the ultrasonic sensor can have transmission and reception performance due to an increase in surface area according to refinement of the silver nanoparticles.

The silver paste can include 90 to 95 wt % of silver nanoparticles and 5 to 10 wt % of a binder. If the silver paste has less than 90 wt % of silver nanoparticles, there can be a problem in that conductivity of the electrode is lowered.

The upper electrode 16 can be prepared by performing a screen printing process or a spraying process on a solvent in which the silver (Ag) paste is diluted, and can be prepared as an ethanol-based solvent not to use harmful organic solvents such as ketone-based solvents used in a solution process.

FIG. 32E illustrates an ultrasonic sensor in a state manufactured by FIG. 32D. With reference to FIG. 32E, the second wire 44 can be disposed at an upper surface of the piezoelectric member 14 and can be disposed to surround the upper electrode 16 so as to be electrically connected to the upper electrode 16. The second wire 44 can be formed of a copper tape having high electrical conductivity, but the embodiments of the present disclosure are not limited thereto.

Next, as illustrated in the ultrasonic sensor according to the embodiment and other embodiments of the present disclosure in FIGS. 1 and 2, the ultrasonic sensor manufactured by FIG. 32E can further include the platen 2 and the ultrasonic sensor controller 4 to operate as the independent ultrasonic sensor 1, and can be mounted at the portable electronic apparatus PED as illustrated in FIGS. 4 and 5 to drive as an ultrasonic sensor detecting recognition information of the user 3.

According to an embodiment of the present disclosure, in the ultrasonic sensor and the display apparatus including the same, the piezoelectric member and the upper electrode are stable in structure and process.

In addition, according to an embodiment of the present disclosure, a structure in which an ultrasonic wave transmission and reception sensitivity of an ultrasonic sensor and a display apparatus including the same are improved can be provided.

An ultrasonic sensor and a display apparatus according to the present disclosure can be described as follows.

An ultrasonic sensor according to an embodiment of the present disclosure can include a substrate, a piezoelectric member disposed at the substrate, and an upper electrode disposed on the piezoelectric member, and the upper electrode can include a silver paste.

According to some embodiments of the present disclosure, the substrate can be electrically connected to a rear surface of the piezoelectric member.

According to some embodiments of the present disclosure, the ultrasonic sensor can be configured to generate ultrasonic waves and receives reflected ultrasonic waves.

According to some embodiments of the present disclosure, the silver paste can include silver epoxy or silver paint.

According to some embodiments of the present disclosure, the silver paste can include a silver nanoparticle and a resin binder.

According to some embodiments of the present disclosure, the silver paste can include 90 to 95 wt % of the silver nanoparticle and 5 to 10 wt % of the resin binder.

According to some embodiments of the present disclosure, the silver nanoparticle can have a size of 200 nm or less.

According to some embodiments of the present disclosure, the upper electrode can be formed using a silver paste and an alcohol solvent.

According to some embodiments of the present disclosure, surface roughness of the upper electrode can be 0.01 μm or less.

According to some embodiments of the present disclosure, a thickness of the upper electrode can be 10 μm or less.

According to some embodiments of the present disclosure, the piezoelectric member can include polyvinylidene fluoride (PVDF) or polyvinylidene fluoride-trifluoroethylene (PVDF-TrFE).

According to some embodiments of the present disclosure, the substrate can be a metal substrate, and the metal substrate can be a brass substrate or an aluminum substrate.

According to some embodiments of the present disclosure, the ultrasonic sensor can further include a conductive adhesive member disposed between the substrate and the piezoelectric member, the conductive adhesive member can include at least one of a silicone-based adhesive, a conductive epoxy adhesive, an insulating epoxy adhesive, and an acrylic-based ultraviolet adhesive.

According to some embodiments of the present disclosure, a thickness of the conductive adhesive member can be 5 μm or less.

According to some embodiments of the present disclosure, the ultrasonic sensor can further include an ultrasonic sensor controller disposed adjacent to one side of the ultrasonic sensor and configured to control the ultrasonic sensor, the ultrasonic sensor controller includes a flexible printed circuit, an ultrasonic sensor integrated circuit mounted at one side of the flexible printed circuit, and a first wire and a second wire mounted at another side of the flexible printed circuit, and electrically connected to one surface and the other surface of the ultrasonic sensor.

According to some embodiments of the present disclosure, the first wire can be in contact with at least a portion of a rear surface of the substrate, and the second wire can be in contact with at least a portion of a side surface of the upper electrode.

According to some embodiments of the present disclosure, the second wire can be disposed to surround the upper electrode.

According to some embodiments of the present disclosure, the upper electrode can be exposed at an uppermost portion of the upper electrode.

A display apparatus according to some embodiments of the present disclosure can include a substrate, a piezoelectric member disposed on the substrate, a lower electrode disposed under the piezoelectric member, an upper electrode disposed to face the lower electrode and disposed on the piezoelectric member, and a supporting member disposed between the substrate and the lower electrode, the upper electrode and the lower electrode include a silver paste.

According to some embodiments of the present disclosure, the ultrasonic sensor can comprise a plurality of pixels, and each of the plurality of pixels can include the piezoelectric member, the lower electrode, and the upper electrode.

According to some embodiments of the present disclosure, each of the piezoelectric member, the lower electrode and the upper electrode in each of the plurality of pixels can be spaced apart from each other by a predetermined distance.

According to some embodiments of the present disclosure, the silver paste can include a silver nanoparticle and a binder.

According to some embodiments of the present disclosure, the sliver paste can include 90 to 95 wt % of the silver nanoparticle and 5 to 10 wt % of the binder.

According to some embodiments of the present disclosure, the silver nanoparticle can have a size of 200 nm or less.

According to some embodiments of the present disclosure, the upper electrode and the lower electrode can be formed using the silver paste and an ethanol-based solvent.

According to some embodiments of the present disclosure, the piezoelectric member can include polyvinylidene fluoride (PVDF) or polyvinylidene fluoride-trifluoroethylene (PVDF-TrFE).

According to some embodiments of the present disclosure, the substrate can be a plastic substrate.

According to some embodiments of the present disclosure, the supporting member can include brass or aluminum.

According to some embodiments of the present disclosure, the display apparatus can further include a conductive adhesive member disposed between the substrate and the piezoelectric member, the conductive adhesive member includes at least one of a silicone-based adhesive, a conductive epoxy adhesive, an insulating epoxy adhesive, and an acrylic-based ultraviolet adhesive.

According to some embodiments of the present disclosure, the conductive adhesive member can include a first conductive adhesive member disposed to be in contact with the supporting member and a second conductive adhesive member disposed to be in contact with the lower electrode.

According to some embodiments of the present disclosure, the display apparatus can further include an ultrasonic sensor controller disposed adjacent to one side of the ultrasonic sensor and configured to control the ultrasonic sensor, the ultrasonic sensor controller includes a flexible printed circuit, an ultrasonic sensor integrated circuit mounted at one side of the flexible printed circuit, and a first wire and a second wire mounted at another side of the flexible printed circuit, and electrically connected to surfaces of the ultrasonic sensor.

According to some embodiments of the present disclosure, the first wire can be disposed between the substrate and the lower electrode, and the second wire can be in contact with at least a portion of a side surface of the upper electrode.

A display apparatus according to some embodiments of the present disclosure includes a cover member including a display area and an ultrasonic sensor area, a display device disposed at a rear surface of the cover member and overlapping with the display area, and the ultrasonic sensor disposed at the rear surface of the cover member and overlapping with the ultrasonic sensor area.

It will be apparent to those skilled in the art that various modifications and variations may be made in the present disclosure without departing from the technical idea or scope of the disclosures. Thus, it may be intended that embodiments of the present disclosure cover the modifications and variations of the disclosure provided they come within the scope of the appended claims and their equivalents.

What is claimed is:

1. An ultrasonic sensor, comprising:
a substrate;
a piezoelectric member disposed at the substrate;
a conductive adhesive member disposed between the substrate and the piezoelectric member to electrically connect the substrate to the piezoelectric member;
an upper electrode disposed on the piezoelectric member;
a cover plate disposed on the piezoelectric member and configured to receive a fingerprint of a user;
a flexible printed circuit;
a first wire and a second wire electrically connected to the flexible printed circuit;
a counter substrate disposed between the cover plate and the upper electrode; and
an air layer disposed between the cover plate and the upper electrode,
wherein the air layer is surrounded by the cover plate, the counter substrate and the upper electrode,
wherein the counter substrate is configured in a form in which a region corresponding to an area of the piezoelectric member is open, and the air layer is configured on the upper portion of the upper electrode,
wherein the upper electrode includes a silver paste,
wherein the upper electrode is disposed between the cover plate and the piezoelectric member, and the upper electrode has a flat surface facing toward the cover plate, and
wherein the second wire is disposed to surround an outer perimeter of the upper electrode in a plan view.

2. The ultrasonic sensor of claim 1, wherein the substrate is electrically connected to a rear surface of the piezoelectric member.

3. The ultrasonic sensor of claim 1, wherein the ultrasonic sensor is configured to generate ultrasonic waves and receives reflected ultrasonic waves.

4. The ultrasonic sensor of claim 1, wherein the silver paste includes a silver epoxy or a silver paint.

5. The ultrasonic sensor of claim 1, wherein the silver paste includes a silver nanoparticle and a resin binder.

6. The ultrasonic sensor of claim 5, wherein the silver nanoparticle has a size of approximately 200 nm or less.

7. The ultrasonic sensor of claim 1, wherein the upper electrode is formed using the silver paste and an alcohol solvent.

8. The ultrasonic sensor of claim 1, wherein the flat surface of the upper electrode has a surface roughness of approximately 0.01 μm or less.

9. The ultrasonic sensor of claim 1, wherein a thickness of the upper electrode is approximately 10 μm or less.

10. The ultrasonic sensor of claim 1, wherein the piezoelectric member includes polyvinylidene fluoride (PVDF) or polyvinylidene fluoride-trifluoroethylene (PVDF-TrFE).

11. The ultrasonic sensor of claim 1, wherein the substrate is a metal substrate, and the metal substrate is a brass substrate or an aluminum substrate.

12. The ultrasonic sensor of claim 11, wherein the conductive adhesive member includes a conductive epoxy adhesive.

13. The ultrasonic sensor of claim 12, wherein a thickness of the conductive adhesive member is approximately 5 μm or less.

14. The ultrasonic sensor of claim 1, further comprising:
an ultrasonic sensor controller disposed adjacent to one side of the ultrasonic sensor, and configured to control the ultrasonic sensor,
wherein the ultrasonic sensor controller includes:
the flexible printed circuit;
an ultrasonic sensor integrated circuit mounted at one side of the flexible printed circuit; and
the first wire and the second wire mounted at another side of the flexible printed circuit, and electrically connected to one surface and another surface of the ultrasonic sensor.

15. The ultrasonic sensor of claim 14, wherein the first wire is in contact with at least a portion of a rear surface of the substrate, and the second wire is in contact with at least a portion of a side surface of the upper electrode.

16. The ultrasonic sensor of claim 15, wherein the upper electrode is exposed at an uppermost portion of the upper electrode.

17. A display apparatus, comprising:
a cover member including a display area and an ultrasonic sensor area;
a display device disposed at a rear surface of the cover member and the display area in an overlapping manner; and
the ultrasonic sensor according to claim 1, disposed at the rear surface of the cover member and overlapping with the ultrasonic sensor area.

18. An ultrasonic, sensor comprising:
a piezoelectric member disposed on a substrate;
a lower electrode disposed under the piezoelectric member;
an upper electrode disposed to face the lower electrode and disposed on the piezoelectric member;
a supporting member disposed between the substrate and the lower electrode;
a conductive adhesive member disposed between the substrate and the piezoelectric member to electrically connect the supporting member to the lower electrode;
a cover plate disposed on the piezoelectric member and configured to receive a fingerprint of a user;
a flexible printed circuit;
a first wire and a second wire electrically connected to the flexible printed circuit;
a counter substrate disposed between the cover plate and the upper electrode; and
an air layer disposed between the cover plate and the upper electrode,
wherein the air layer is surrounded by the cover plate, the counter substrate and the upper electrode,
wherein the counter substrate is configured in a form in which a region corresponding to an area of the piezoelectric member is open, and the air layer is configured on the upper portion of the upper electrode,
wherein the upper electrode and the lower electrode include a silver paste,
wherein the upper electrode is disposed between the cover plate and the piezoelectric member, and the upper electrode has a flat surface facing toward the cover plate, and
wherein the second wire is disposed to surround an outer perimeter of the upper electrode in a plan view.

19. The ultrasonic sensor of claim 18, wherein the ultrasonic sensor comprises a plurality of pixels, and each of the plurality of pixels includes the piezoelectric member, the lower electrode, and the upper electrode.

20. The ultrasonic sensor of claim 19, wherein each of the piezoelectric member, the lower electrode and the upper electrode in each of the plurality of pixels are spaced apart from each other by a predetermined distance.

21. The ultrasonic sensor of claim 18, wherein the silver paste includes a silver nanoparticle and a binder.

22. The ultrasonic sensor of claim 21, wherein the silver nanoparticle has a size of 200 nm or less.

23. The ultrasonic sensor of claim 18, wherein the upper electrode and the lower electrode are formed using the silver paste and an ethanol-based solvent.

24. The ultrasonic sensor of claim 18, wherein the piezoelectric member includes polyvinylidene fluoride (PVDF) or polyvinylidene fluoride-trifluoroethylene (PVDF-TrFE).

25. The ultrasonic sensor of claim 18, wherein the substrate is a plastic substrate.

26. The ultrasonic sensor of claim 18, wherein the supporting member includes brass or aluminum.

27. The ultrasonic sensor of claim 26, wherein the conductive adhesive member includes a conductive epoxy adhesive.

28. The ultrasonic sensor of claim 27, wherein the conductive adhesive member includes:
a first conductive adhesive member disposed to be in contact with the supporting member; and
a second conductive adhesive member disposed to be in contact with the lower electrode.

29. The ultrasonic sensor of claim 18, further comprising:
an ultrasonic sensor controller disposed adjacent to one side of the ultrasonic sensor and configured to control the ultrasonic sensor,
wherein the ultrasonic sensor controller includes:
the flexible printed circuit;
an ultrasonic sensor integrated circuit mounted at one side of the flexible printed circuit; and
the first wire and the second wire mounted at another side of the flexible printed circuit, and electrically connected to surfaces of the ultrasonic sensor.

30. The ultrasonic sensor of claim 29, wherein the first wire is disposed between the substrate and the lower electrode, and the second wire is in contact with at least a portion of a side surface of the upper electrode.

* * * * *